United States Patent
Yoon et al.

(10) Patent No.: US 7,586,149 B2
(45) Date of Patent: Sep. 8, 2009

(54) CIRCUIT DEVICE INCLUDING VERTICAL TRANSISTORS CONNECTED TO BURIED BITLINES AND METHOD OF MANUFACTURING THE SAME

(75) Inventors: Jae-man Yoon, Seoul (KR); Dong-gun Park, Seongnam-si (KR); Kang-yoon Lee, Seongnam-si (KR); Choong-ho Lee, Seongnam-si (KR); Bong-soo Kim, Seongnam-si (KR); Seong-goo Kim, Seoul (KR); Hyeoung-won Seo, Yongin-si (KR); Seung-bae Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 229 days.

(21) Appl. No.: 11/541,756

(22) Filed: Oct. 2, 2006

(65) Prior Publication Data

US 2007/0075359 A1   Apr. 5, 2007

(30) Foreign Application Priority Data

Oct. 5, 2005   (KR) ..................... 10-2005-0093317

(51) Int. Cl.
*H01L 23/528* (2006.01)
*H01L 27/108* (2006.01)

(52) U.S. Cl. ............... 257/329; 257/328; 257/E23.151; 257/E27.097

(58) Field of Classification Search ................ 257/208, 257/210, 211, 328, 329, E27.081, E27.097, 257/E23.141, E23.151, E23.175
See application file for complete search history.

(56) References Cited

U.S. PATENT DOCUMENTS

| | | | | |
|---|---|---|---|---|
| 5,828,094 A * | 10/1998 | Lee | ............................ | 257/296 |
| 5,885,864 A * | 3/1999 | Ma | ............................. | 438/253 |
| 5,994,735 A * | 11/1999 | Maeda et al. | ............... | 257/329 |
| 6,114,725 A * | 9/2000 | Furukawa et al. | ........... | 257/330 |
| 6,246,083 B1 * | 6/2001 | Noble | ......................... | 257/296 |
| 6,329,239 B2 | 12/2001 | Koh et al. | .................... | 438/253 |
| 7,120,046 B1 * | 10/2006 | Forbes | ........................ | 365/149 |
| 2002/0114191 A1 * | 8/2002 | Iwata et al. | ............ | 365/185.23 |
| 2006/0097304 A1 * | 5/2006 | Yoon et al. | .................. | 257/307 |

FOREIGN PATENT DOCUMENTS

| | | |
|---|---|---|
| JP | 08/316434 | 11/1996 |
| JP | 2003-209189 | 7/2003 |
| KR | 10-0209212 | 4/1999 |

* cited by examiner

*Primary Examiner*—Anh Phung
*Assistant Examiner*—Allison P Bernstein
(74) *Attorney, Agent, or Firm*—Mills & Onello LLP

(57) ABSTRACT

A circuit device including vertical transistors connected to buried bitlines and a method of manufacturing the circuit device. The circuit device includes a semiconductor substrate including a peripheral circuit region and left and right cell regions at both sides of the peripheral circuit region, bottom active regions arranged on the semiconductor substrate to be spaced apart from one another in a column direction and to extend from the peripheral circuit region alternately to the left cell region and the right cell region in a row direction, channel pillars protruding from the bottom active regions in a vertical direction and arranged to be aligned in the row direction and spaced apart from one another, gate electrodes provided with a gate dielectric layer and attached to surround side surfaces of the channel pillars, and buried bitlines extending along the bottom active regions, the bottom active regions including a bottom source/drain region.

20 Claims, 35 Drawing Sheets

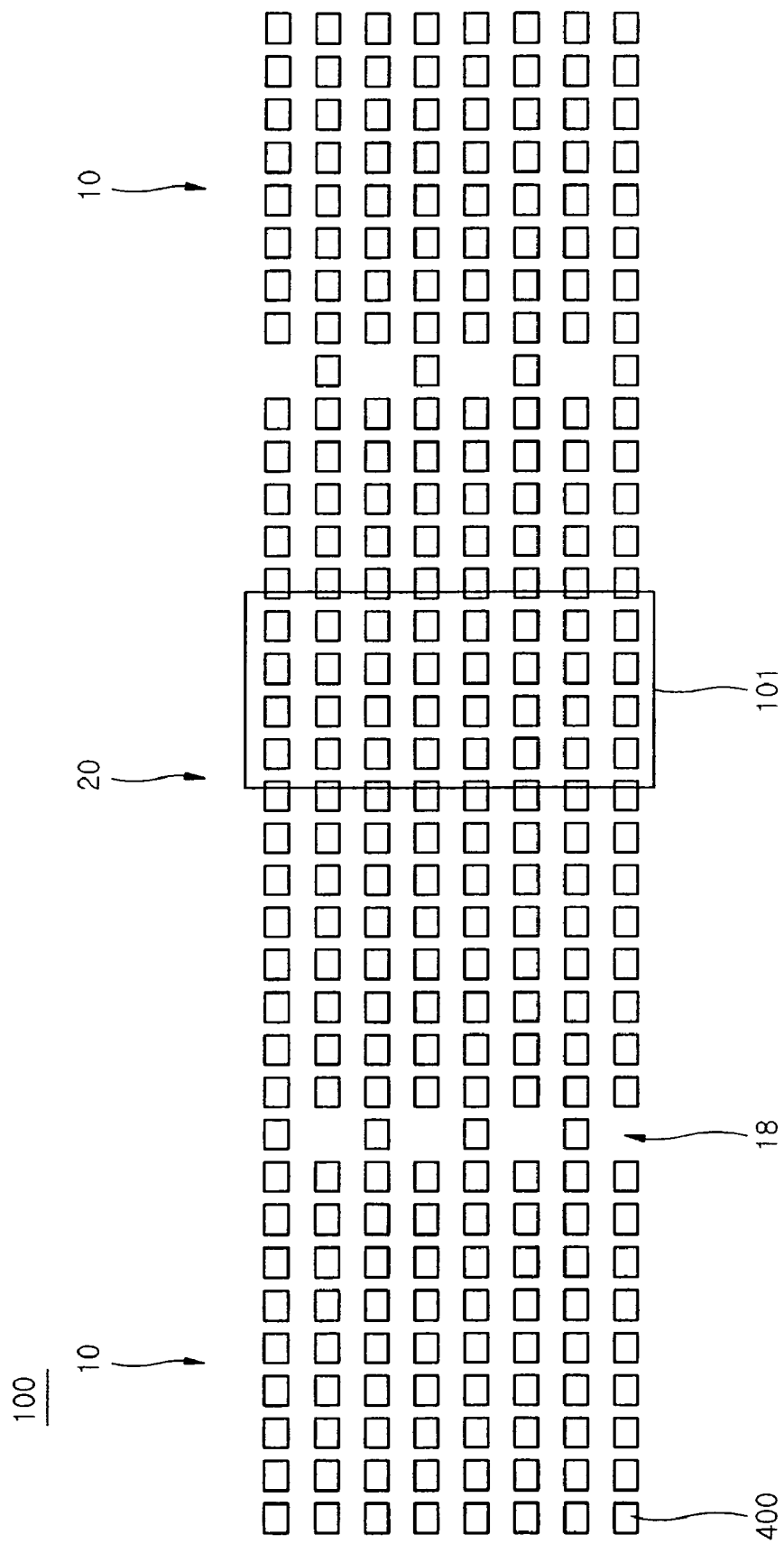

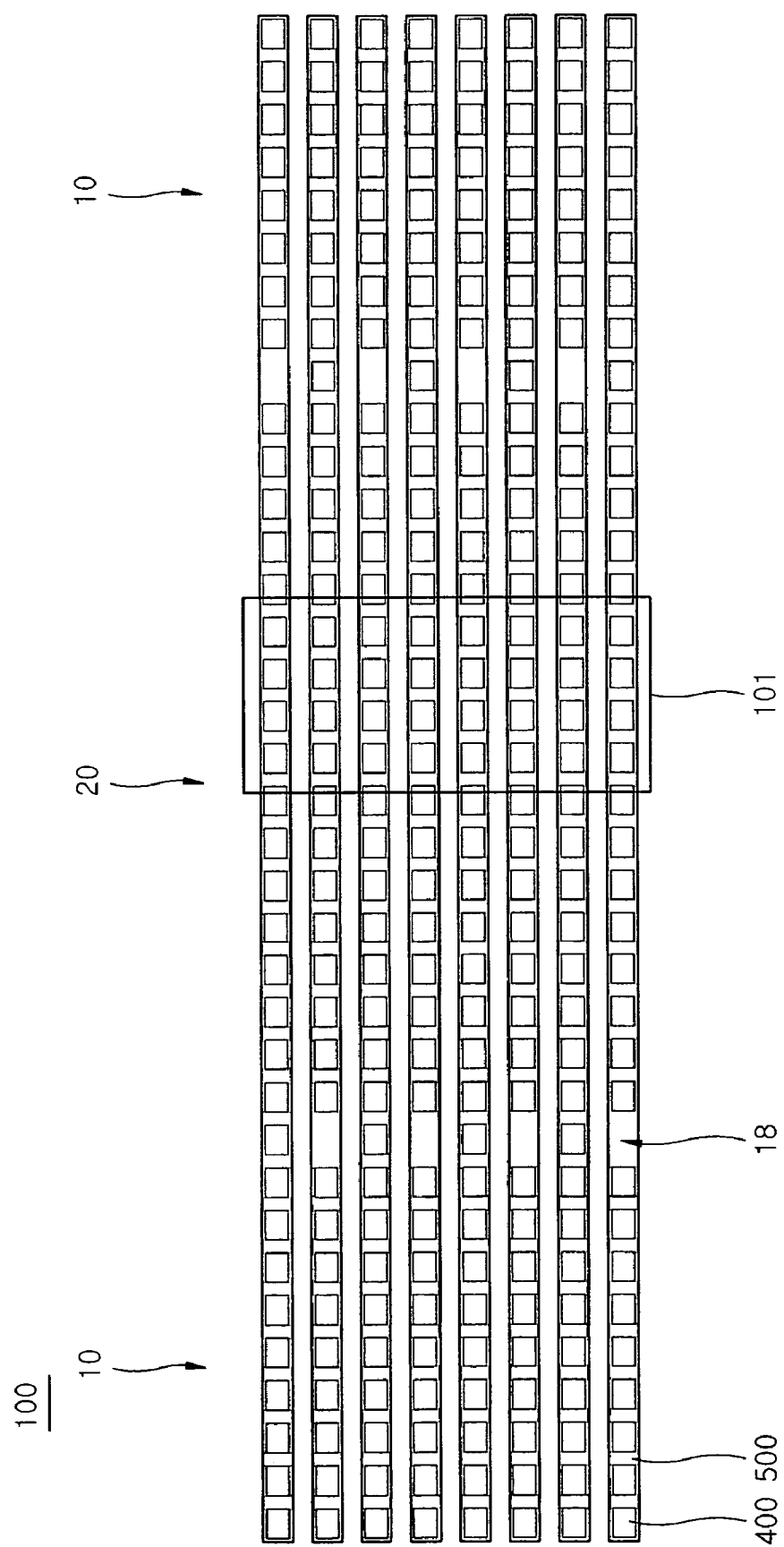

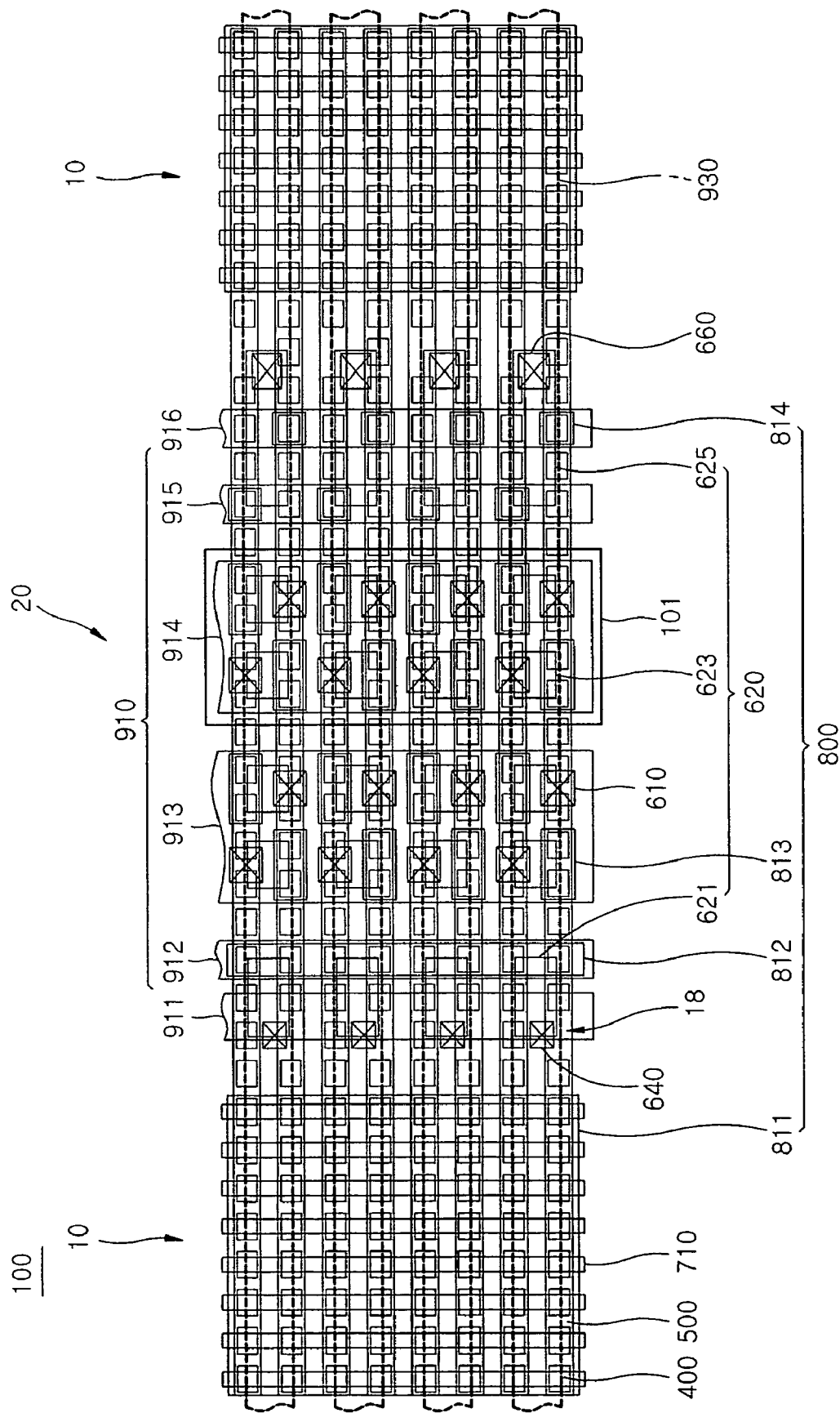

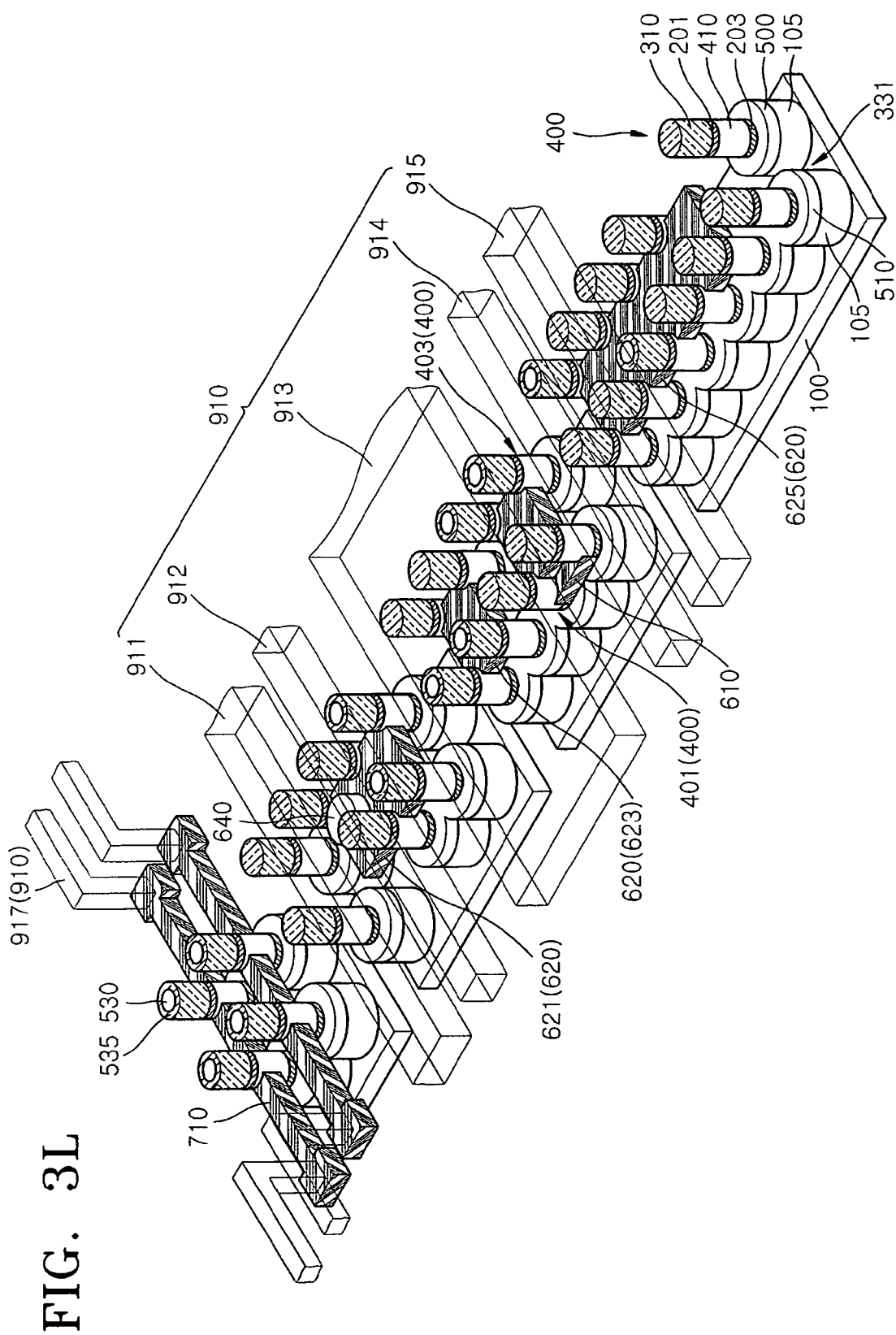

CIRCUIT DEVICE INCLUDING VERTICAL TRANSISTORS CONNECTED TO BURIED BITLINES AND METHOD OF MANUFACTURING THE SAME

CROSS-REFERENCE TO RELATED PATENT APPLICATION

This application claims priority to Korean Patent Application No. 10-2005-0093317, filed on Oct. 5, 2005, in the Korean Intellectual Property Office, the contents of which are herein incorporated by reference in their entirety.

BACKGROUND OF THE INVENTION

1. Field of the Invention

The present invention relates to a semiconductor circuit device, and more particularly, to a circuit device including vertical transistors connected to buried bitlines and a method of manufacturing the circuit device.

2. Description of the Related Art

As the integration density of semiconductor devices increases, the design rule must necessarily rapidly decrease to enable the integration of more devices on a substrate with a limited area, leading to a decrease in the width and length of a cell transistor of a memory device (e.g., a DRAM). The reduction of the design rule commonly results in the generation of the short channel effect phenomenon and/or degraded current driving performance of an active device such as a transistor.

Accordingly, vertical transistors have been developed for addressing the switching performance degradation associated with miniaturization of conventional planar transistors.

Also, many attempts have been made to reduce the occupation area of peripheral circuit devices for driving a DRAM cell transistor, for example, circuit devices such as sense amplifiers that include CMOS transistors forming a balanced flip-flop structure.

It would be more favorable for the reduction of the design rule if peripheral circuits were also constructed to include vertical transistors. In particular, when a cell transistor is implemented as a vertical transistor, the occupation area of the peripheral circuit device can also be greatly reduced. Therefore, in order to implement a peripheral circuit device such as the sense amplifier in a reduced substrate area, it is favorable if the peripheral circuit region is also constructed to include vertical transistors.

However, implementation of the peripheral circuit device described above not only requires the implementation of vertical transistors in the peripheral circuit region but other critical considerations include the formation of local interconnection lines for the transistors and/or the arrangement of sense amplifiers connected to bitlines.

SUMMARY OF THE INVENTION

Accordingly, an interconnection line structure for the transistors and/or an electrical connection line structure between the cell transistors and the peripheral circuit device, and methods for manufacturing the same, are provided in the present disclosure.

Embodiments of the present invention provide a circuit device including vertical transistors and interconnection lines connecting the vertical transistors and methods of manufacturing the circuit device, which can reduce a substrate area required for a peripheral circuit region.

In one aspect, the present invention is directed to a circuit device including vertical transistors, the circuit device comprising: a semiconductor substrate including a peripheral circuit region and left and right cell regions at both sides of the peripheral circuit region; bottom active regions arranged on the semiconductor substrate to be spaced apart from one another in a column direction and to extend from the peripheral circuit region alternately to the left cell region and the right cell region in a row direction; channel pillars protruding from the bottom active regions in a vertical direction and arranged to be aligned in the row direction and spaced apart from one another; gate electrodes provided with a gate dielectric layer and attached to surround side surfaces of the channel pillars; buried bitlines extending along the bottom active regions, the bottom active regions including a bottom source/drain region; local interconnection lines contacting side surfaces of the gate electrodes in the peripheral circuit region and extending between the gate electrodes to commonly interconnect the gate electrodes in the peripheral circuit region, thereby configuring a peripheral circuit; signal lines electrically connected to upper surfaces of the channel pillars or to at least one of the local interconnection line; and interconnection contacts electrically connecting the local interconnection lines to the buried bitline of a different row from that of the commonly-connected gate electrodes or electrically connecting the local interconnection lines to the signal lines, thereby configuring the peripheral circuit.

In one embodiment, the bottom active region is extended to one of the left and right cell regions but disconnected with respect to the other of the left and right cell regions such that the buried bitline is extended from the peripheral circuit region only to the one of the left and right cell regions.

In another embodiment, the buried bitline includes an impurity region self-aligned with the gate electrode by ion implantation of impurities into the bottom active region exposed between neighboring gate electrodes.

In another embodiment, the local interconnection line is disposed between two gate electrodes, each belonging to a different row, to electrically interconnect the two gate electrodes.

In another embodiment, the device can further comprise an insulation mask insulating the upper surface of the channel pillar to define the channel pillar with the neighboring gate electrode attached thereto as a dummy pillar so as to allow the interconnection line to contact another gate electrode neighboring the gate electrode in the row direction.

In another embodiment, the device can further comprise an insulation mask insulating the upper surface of the channel pillars to define the channel pillars with the gate electrodes of the neighboring row attached thereto as a dummy pillar so as to allow the local interconnection line to be extended to contact two gate electrodes of a particular row and a gate electrode of a row different from the particular row such that the two gate electrodes of the particular row are electrically interconnected.

In another embodiment, the device can further comprise an insulation mask insulating the signal line from the upper surface of the channel pillar neighboring the channel pillar electrically connected to the signal line, thereby defining the neighboring channel pillar as a dummy pillar.

In another embodiment, the interconnection contact connected to the buried bitline is formed to contact the gate electrode adjacent to the connected portion, and the circuit device further comprises an insulation mask electrically insulating the upper surface of the channel pillar such that the channel pillar to which the gate electrode contacting the interconnection contact is attached is defined as a dummy pillar.

In another embodiment, the peripheral circuit is an equalizer, a sense amplifier or a column selector for a memory operation of cell transistors including the gate electrode and the cannel pillar formed in the cell region.

In another embodiment, the device can further comprise another local interconnection line formed together with the signal line to locally connect the channel pillars of the different row and formed to have a substantially same height relative to the substrate as that of the signal line.

In another embodiment, the buried bitline includes first and second buried bitlines with a different conductivity type, the first and second buried bitlines being interconnected, and the circuit device can further comprise another local interconnection line formed together with the signal line to interconnect the first and second buried bitlines and formed to have a substantially same height relative to the substrate as that of the signal line and another contact hole connecting the another local interconnection line to each of the first and second buried bitlines.

In another embodiment, the first and second buried bitlines are spaced apart form each other by device isolation.

In another embodiment, the device can further comprise a top contact electrically connecting the channel pillar to the signal line.

In another aspect, the present invention is directed to a circuit device comprising: a semiconductor substrate including a peripheral circuit region and left and right cell regions at both sides of the peripheral circuit region; bottom active regions arranged on the semiconductor substrate to be spaced apart from one another in a column direction and to extend from the peripheral circuit region alternately to the left cell region and the right cell region in a row direction; channel pillars protruding from the bottom active regions in a vertical direction and arranged to be aligned in the row direction and spaced apart from one another; gate electrodes provided with a gate dielectric layer and attached to surround side surfaces of the channel pillars; buried bitlines extending along the bottom active regions, the bottom active regions including a bottom source/drain region formed outside the gate electrodes; local interconnection lines contacting side surfaces of the gate electrodes of different rows in the peripheral circuit region and extending between the gate electrodes to commonly interconnect the gate electrodes in the peripheral circuit region, thereby configuring a peripheral circuit including an equalizer; a first signal line electrically connected to upper surfaces of the two channel pillars of different rows, the two channel pillars each having a gate electrode contacting the local interconnection line; a second signal line electrically connected to the local interconnection line; and an interconnection contact formed on the local interconnection line to electrically connect the second signal line to the local interconnection line.

In one embodiment, the device can further comprise an insulation mask insulating the signal line from the upper surface of the channel pillar neighboring the channel pillar electrically connected to the first signal line, thereby defining the neighboring channel pillar as a dummy pillar.

In another aspect, the present invention is directed to a circuit device can comprise: a semiconductor substrate including a peripheral circuit region and left and right cell regions at both sides of the peripheral circuit region; bottom active regions arranged on the semiconductor substrate to be spaced apart from one another in a column direction and to extend from the peripheral circuit region alternately to the left cell region and the right cell region in a row direction; channel pillars protruding from the bottom active regions in a vertical direction and arranged to be aligned in the row direction and spaced apart from one another; gate electrodes provided with a gate dielectric layer and attached to surround side surfaces of the channel pillars; buried bitlines extending along the bottom active regions, the bottom active regions including a bottom source/drain region formed in each bottom active region at a side of the gate electrodes; a signal line electrically and commonly connected to upper surfaces of the channel pillars of different rows in the peripheral circuit region; local interconnection lines connecting each of the gate electrodes to the buried bitline of a row different from that of the gate electrodes, thereby configuring a peripheral circuit including a sense amplifier; and an interconnection contact electrically connecting the local interconnection line to the buried bitline of the different rows.

In one embodiment, the device can further comprise an insulation mask insulating the signal line from the upper surface of the channel pillar neighboring the interconnection contact and facing the channel pillar of a different row electrically connected to the signal line, thereby defining the neighboring channel pillar as a dummy pillar.

In another aspect, the present invention is directed to a circuit device comprising: a semiconductor substrate including a peripheral circuit region and left and right cell regions at both sides of the peripheral circuit region; bottom active regions arranged on the semiconductor substrate to be spaced apart from one another in a column direction and to extend from the peripheral circuit region alternately to the left cell region and the right cell region in a row direction; channel pillars protruding from the bottom active regions in a vertical direction and arranged to be aligned in the row direction and spaced apart from one another; gate electrodes provided with a gate dielectric layer and attached to surround side surfaces of the channel pillars; buried bitlines extending along the bottom active regions, the bottom active regions including a bottom source/drain region formed in each bottom active region at a side of the gate electrodes; a first signal line electrically connected to an upper surface of the channel pillar of a row in the peripheral circuit region; a second signal line electrically connected to the upper surface of the channel pillar of a row neighboring the row including the channel pillar connected to the firs signal line; and a local interconnection line extended from the surface of the gate electrode to electrically connect the gate electrodes attached to the two channel pillars, thereby configuring a peripheral circuit including a column selector; a third signal line electrically connected to the local interconnection line; and an interconnection contact formed on the local interconnection line to electrically connect the third signal line to the local interconnection line.

In one embodiment, the circuit device can further comprise an insulation mask insulating the signal line from the upper surface of the channel pillar neighboring, in the row direction, the channel pillar connected to the first and second signal lines, thereby defining the neighboring channel pillar as a dummy pillar.

In another aspect, the present invention is directed to a circuit device comprising: a semiconductor substrate including a peripheral circuit region and left and right cell regions at both sides of the peripheral circuit region; bottom active regions arranged on the semiconductor substrate to be spaced apart from one another in a column direction and to extend from the peripheral circuit region alternately to the left cell region and the right cell region in a row direction; channel pillars protruding from the bottom active regions in a vertical direction and arranged to be aligned in the row direction and spaced apart from one another; gate electrodes surrounding sidewalls of the channel pillars; buried bitlines extending along the bottom active regions, the bottom active regions including a bottom source/drain region; an upper source/drain region disposed on the channel pillars; a first gate dielectric layer disposed between the gate electrodes and the upper source/drain region; a second gate dielectric layer disposed between the gate electrodes and the channel pillars; local interconnection lines contacting side surfaces of the gate electrodes in the peripheral circuit region and extending between the gate electrodes to commonly interconnect the gate electrodes in the peripheral circuit region, thereby configuring a peripheral circuit; signal lines electrically connected to upper surfaces of the channel pillars or at least one of the local interconnection lines; and interconnection contacts electrically connecting the local interconnection line to the buried bitline of a different row from that of the commonly-connected gate electrodes or electrically connecting the local interconnection lines to the signal lines, thereby configuring the peripheral circuit.

In another aspect, the present invention is directed to a method of manufacturing a circuit device including vertical transistors, the method comprising: forming first hard masks with a first gate electrode dielectric layer, the first hard masks being arranged in column and row directions on a semiconductor substrate including a peripheral circuit region and left and right cell regions at both sides of the peripheral circuit region and being disconnected at an interface between the left and right cell regions, the disconnected portions being alternately arranged in the row direction; forming preliminary pillars by etching the semiconductor substrate using the first hard mask as an etch mask; forming channel pillars having a line width smaller than that of the first hard mask by recessing the side surfaces of the preliminary pillars in a sidedirection; filling the recessed portions to form gate electrodes attached to sidewalls of the channel pillars together with a second dielectric layer to surround the sidewalls of the channel pillars; forming an impurity region by implanting impurity ions into the exposed portion of the semiconductor substrate using the first hard mask as an ion implantation mask; forming a second hard mask having a spacer shape, the second hard mask filling a gap between the gate electrodes in the row direction in such a manner so as to be disconnected at the disconnected portion and not filling the gap in the column direction to expose the corresponding portion of the semiconductor substrate; etching the semiconductor substrate using the second hard mask as an etch mask to define bottom active regions arranged on the semiconductor substrate to be spaced apart from one another in the column direction and to be extended from the peripheral circuit region alternately to the left cell region and the right cell region in the row direction, and separating the impurity region from the bottom active regions by the bottom active region to form a trench groove defining a buried bitline including a bottom source/drain region; selectively removing the second hard mask; forming a first insulation layer filling the trench groove and the gap between the gate electrodes; selectively etching the first insulation layer to form a damascene groove exposing a side surface of the gate electrode; forming local interconnection lines for a peripheral circuit by selectively filling the damascene groove, the local interconnection lines being in contact with side surfaces of the gate electrodes in the peripheral circuit region and extending outside to commonly interconnect the gate electrodes in the peripheral circuit region; forming a second insulation layer filling regions on the local interconnection lines; forming, on the local interconnection lines, signal lines electrically connected to upper surfaces of the channel pillars or to at least one of the local interconnection lines; and forming an interconnection contact for the peripheral circuit, the interconnection contact penetrating the first insulation layer to electrically connect the local interconnection line and the buried bitline or penetrating the second insulation layer to electrically connect the local interconnection line and the signal line.

In one embodiment, the forming of the local interconnection lines includes:

forming a conductive layer filling the damascene groove; polishing the conductive layer by CMP (chemical mechanical polishing); and recessing the polished conductive layer by an etch-back process.

In another embodiment, the conductive layer filling the damascene groove formed in the cell region forms a wordline.

In another embodiment, the method can further comprise before the forming of the signal lines: selectively removing the first hard mask on the channel pillar to be connected to the signal lines; forming an insulation spacer exposing the upper surface of the channel pillar on the sidewall of a contact hole formed by the removal of the first hard mask; and forming a top source/drain region contact in contact with the upper surface of the channel pillar.

In another embodiment, the first hard mask on the channel pillar not in contact with the signal lines remains as an insulation mask for forming the channel pillar as the dummy pillar during the selective removing of the first hard mask.

In another embodiment, the first hard masks disposed in the cell region are all removed during the removing of the first hard mask.

In another embodiment, a second local interconnection line connecting the channel pillars is also formed during the forming of the signal line.

In another embodiment, the buried bitline is formed to include first and second buried bitlines of a different conductivity type by implantation of impurities of a different conductivity type after the forming of the impurity region, and the method further comprises: forming, during the forming of the signal line, a second local interconnection line electrically connecting the first and second buried bitlines; and forming, before the forming of the signal line, an interconnection line penetrating the insulation layer to contact with the first and second buried bitline.

In another embodiment, the method can further comprise, after the forming of the signal line, forming a cylindrical capacitor electrically connected to the channel pillar in the cell region.

In another embodiment, the method can further comprise, after the forming of the signal line; forming an intermetal dielectric layer covering the signal line; forming an interconnection contact penetrating the intermetal dielectric layer in contact with the local interconnection line; and forming a second signal line contacting with the interconnection contact.

In another aspect, the present invention is directed to a method of manufacturing a circuit device including vertical transistors, the method comprising: forming first hard masks with a first gate electrode dielectric layer, the first hard masks being arranged in column and row directions on a semiconductor substrate including a peripheral circuit region and left and right cell regions at both sides of the peripheral circuit region and being disconnected at an interface between the left and right cell regions, the disconnected portions being alternately arranged in the row direction; forming preliminary pillars by etching the semiconductor substrate using the first hard mask as an etch mask; forming channel pillars having a line width smaller than that of the first hard mask by recessing the side surfaces of the preliminary pillars in a side direction; filling the recessed portions to form gate electrodes attached to sidewalls of the channel pillars together with a second dielectric layer to surround the sidewalls of the channel pillars; forming an impurity region by implanting impurity ions into the exposed portion of the semiconductor substrate using the first hard mask as an ion implantation mask; forming a second hard mask having a spacer shape, the second hard mask filling a gap between the gate electrodes in the row direction in such a manner so as to be disconnected at the disconnected portion and not filling the gap in the column direction to expose the corresponding portion of the semiconductor substrate; etching the semiconductor substrate using the second hard mask as an etch mask to define bottom active regions arranged on the semiconductor substrate to be spaced apart from one another in the column direction and to be extended from the peripheral circuit region alternately to the left cell region and the right cell region in the row direction, and separating the impurity region from the bottom active regions by the bottom active region to form a trench groove defining a buried bitline including a bottom source/drain region; selectively removing the second hard mask; forming a first insulation layer filling the trench groove and the gap between the gate electrodes; selectively etching the first insulation layer to form a damascene groove exposing a side surface of the gate electrode; forming local interconnection lines for a peripheral circuit by selectively filling the damascene groove, the local interconnection lines being in contact with side surfaces of the gate electrodes in the peripheral circuit region and extending to commonly interconnect the gate electrodes in the peripheral circuit region; forming a second insulation layer filling regions on the local interconnection lines; selectively removing the first hard mask on the channel pillar to define the unremoved hard mask as a dummy pillar; forming an insulation spacer exposing the upper surface of the channel pillar on the sidewall of a contact hole formed by the removal of the first hard mask; forming a top source/drain region contact in contact with an upper surface of the channel pillar; forming, on the insulation layer, a signal line electrically connected to the top source/drain region contact; and forming an interconnection contact for the peripheral circuit, the interconnection contact penetrating the first insulation layer to electrically connect the local interconnection line and the buried bitline or penetrating the second insulation layer to electrically connect the local interconnection line and the signal line.

In another aspect, the present invention is directed to a method of manufacturing a circuit device including vertical transistors, the method comprising: providing a semiconductor substrate including a peripheral circuit region and left and right cell regions at both sides of the peripheral circuit region; forming bottom active regions on the semiconductor substrate to be spaced apart from one another in a column direction and to extend from the peripheral circuit region alternately to the left cell region and the right cell region in a row direction; forming channel pillars protruding from the bottom active regions in a vertical direction and arranged to be aligned in the row direction and spaced apart from one another; forming gate electrodes surrounding side walls of the channel pillars; forming buried bitlines extending along the bottom active regions, the bottom active regions including a bottom source/drain region; forming an upper source/drain region on the channel pillars; forming a first gate dielectric layer between the gate electrodes and the upper source/drain region; forming a second gate dielectric layer between the gate electrodes and the channel pillars; forming local interconnection lines contacting side surfaces of the gate electrodes in the peripheral circuit region and extending between the gate electrodes to commonly interconnect the gate electrodes in the peripheral circuit region, thereby configuring a peripheral circuit; forming signal lines electrically connected to upper surfaces of the channel pillars or to at least one of the local interconnection lines; and forming interconnection contacts electrically connecting the local interconnection line to the buried bitline of a different row from that of the commonly-connected gate electrodes or electrically connecting the local interconnection lines to the signal lines, thereby configuring the peripheral circuit.

BRIEF DESCRIPTION OF THE DRAWINGS

The above and other features and advantages of the present invention will become more apparent by describing in detail exemplary embodiments thereof with reference to the attached drawings in which:

FIGS. 2A through 2I are plan views illustrating a method of manufacturing the circuit device illustrated in FIG. 1 according to an embodiment of the present invention;

DETAILED DESCRIPTION OF EMBODIMENTS OF THE INVENTION

Figure 1:
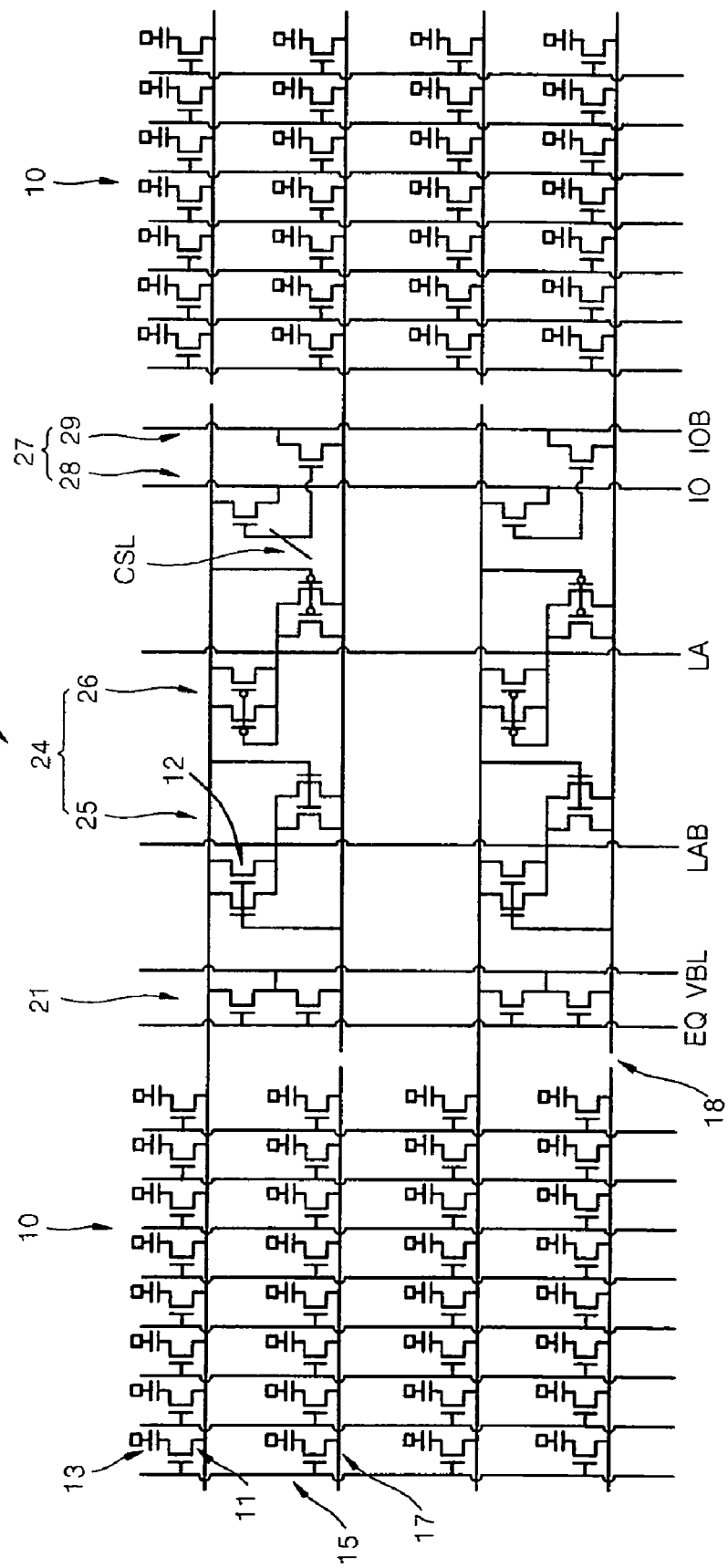
FIG. 1 is a circuit diagram of a circuit device including vertical transistors connected to buried bitlines according to an embodiment of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete.

The present disclosure proposes vertical transistor structures and a technique for implementing a peripheral circuit device that includes an interconnection line structure for interconnecting the vertical transistor structures for construction of, for example, a sense amplifier, and methods for manufacturing the same.

The vertical transistor structures according to the embodiments of the present invention includes a channel pillar that preferably projects or extends in a vertical direction relative to a horizontal upper surface of the substrate, and serves as a channel region of a transistor. Accordingly, first and second drain/source regions serving as junction regions are provided respectively at the top and bottom of the channel pillar. A gate electrode with a gate dielectric layer is attached to the side surface of the channel. The gate electrode can be configured as a cylinder-shaped conductive layer that surrounds the channel pillar.

A plurality of channel pillars can be arranged in a row line, and a buried bitline connecting the bottom first source/drain regions is formed on a portion of the substrate at which the channel pillar stands. Accordingly, the transistors including the channel pillars arranged in a row can be considered as being commonly connected to the buried bitline.

An insulation layer for device isolation is formed between neighboring transistors arranged in a row to isolate the neighboring transistors of the row from each other. Also, for isolation of the transistors of a first row from transistors of a neighboring second row, bottom active regions on which the channel pillars stand can be formed to align with the buried bitline and protrude upwardly from the substrate. That is, a trench can be formed between the bottom active regions, and a device isolation layer of insulative material can be formed to fill the trench.

The substrate can comprises, for example, a semiconductor substrate that includes a peripheral circuit region and left and right cell regions at both sides of the peripheral region, and the bottom active regions can be understood as device isolation regions that extend from the peripheral circuit region to the cell region. That is, the bottom active regions can comprise regions that extend from the peripheral circuit region to the cell region and that protrude from the upper surface of the substrate.

Two neighboring bottom active regions can be formed to extend in opposite directions. That is, a first active region can extend from the peripheral circuit region to the left cell region, and a second active region neighboring the first active region can extend from the peripheral circuit region to the right cell region. At the same time, a predetermined buried bitline aligned with the bottom active region extends from a predetermined peripheral circuit region only to one of cell regions located at both sides of the predetermined peripheral circuit region. That is, two neighboring buried bitlines extend to opposite cell regions, respectively.

Accordingly, it is possible to construct a sense amplifier (SA), an equalizer (EQ) and a column selector (CSL), each having two nodes connected respectively to the two neighboring buried bitlines. The peripheral circuit structure can considered to have an open bitline structure. In this case, since the two neighboring bitlines extend to opposite cell regions, respectively, one SA cell is disposed per two bitlines. That is, the SA cell can be disposed according to a relaxed open bitline structure.

Meanwhile, similar channel pillars can be arranged on the bottom active region extending to the left or right cell region, wherein the similar channel pillars are used to construct cell transistors. In this case, since a buried bitline also extends along the bottom active region, the cell transistors are electrically connected to the peripheral circuit devices by the buried bitline. Likewise, since a gate electrode of the cell transistor is attached to the sidewall of the channel pillar, it is contact-connected by the exposed sidewall to a wordline that extends in a transverse direction with respect to the row direction, for example, in the column direction.

In order to implement a peripheral circuit device such as a sense amplifier, the transistors including the channel pillars are electrically interconnected through various routes. For example, local interconnection lines can be formed to interconnect the transistors so as to construct the circuit. These local interconnection lines can be formed simultaneously with the formation of the wordline of the cell transistor. Some of the local interconnection lines can be formed as contact type to connect the gate electrode and the source/drain region of one or multiple transistors.

In the embodiments of the present disclosure, a memory circuit device including a channel pillar type transistor is formed in the cell region, a peripheral circuit device including a channel pillar type transistor is formed in the peripheral circuit region, and the memory circuit and peripheral circuit devices are connected by the buried bit line. Accordingly, the length of the sense amplifier in the bitline direction can be reduced to ½ or less, as compared to the length in the case where the planar transistor is used.

Figure 2C:
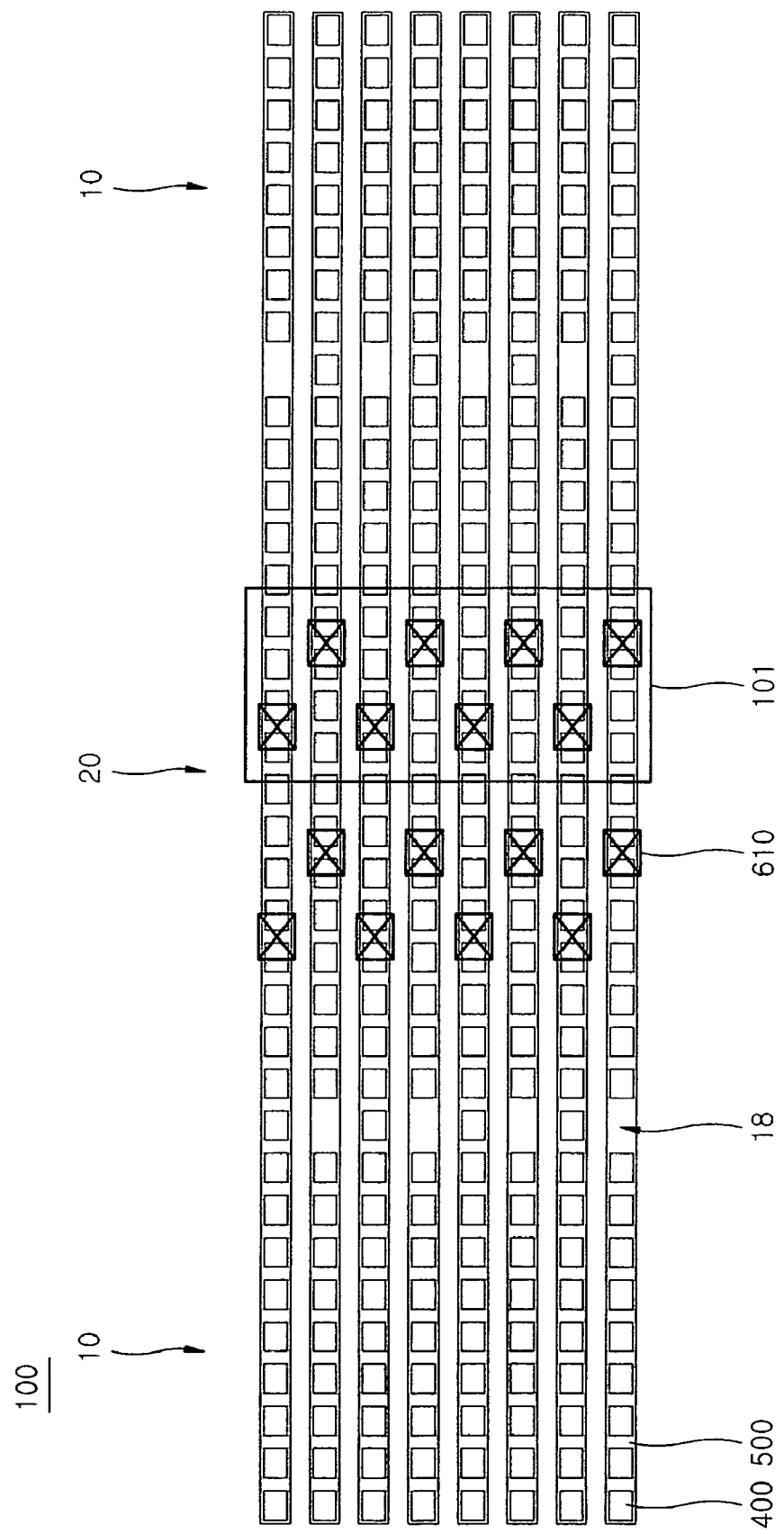
Figure 2D:
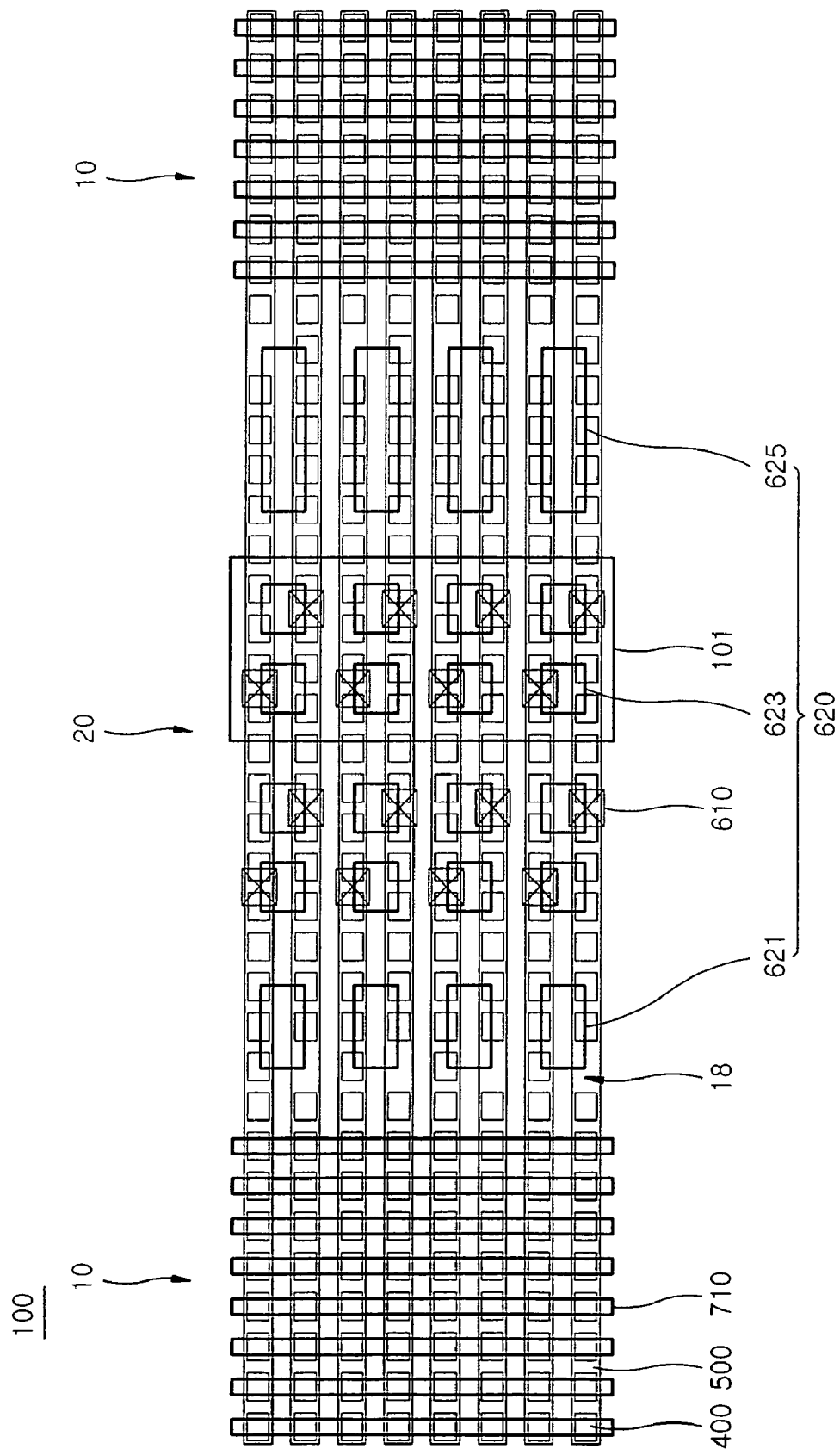
Figure 2E:
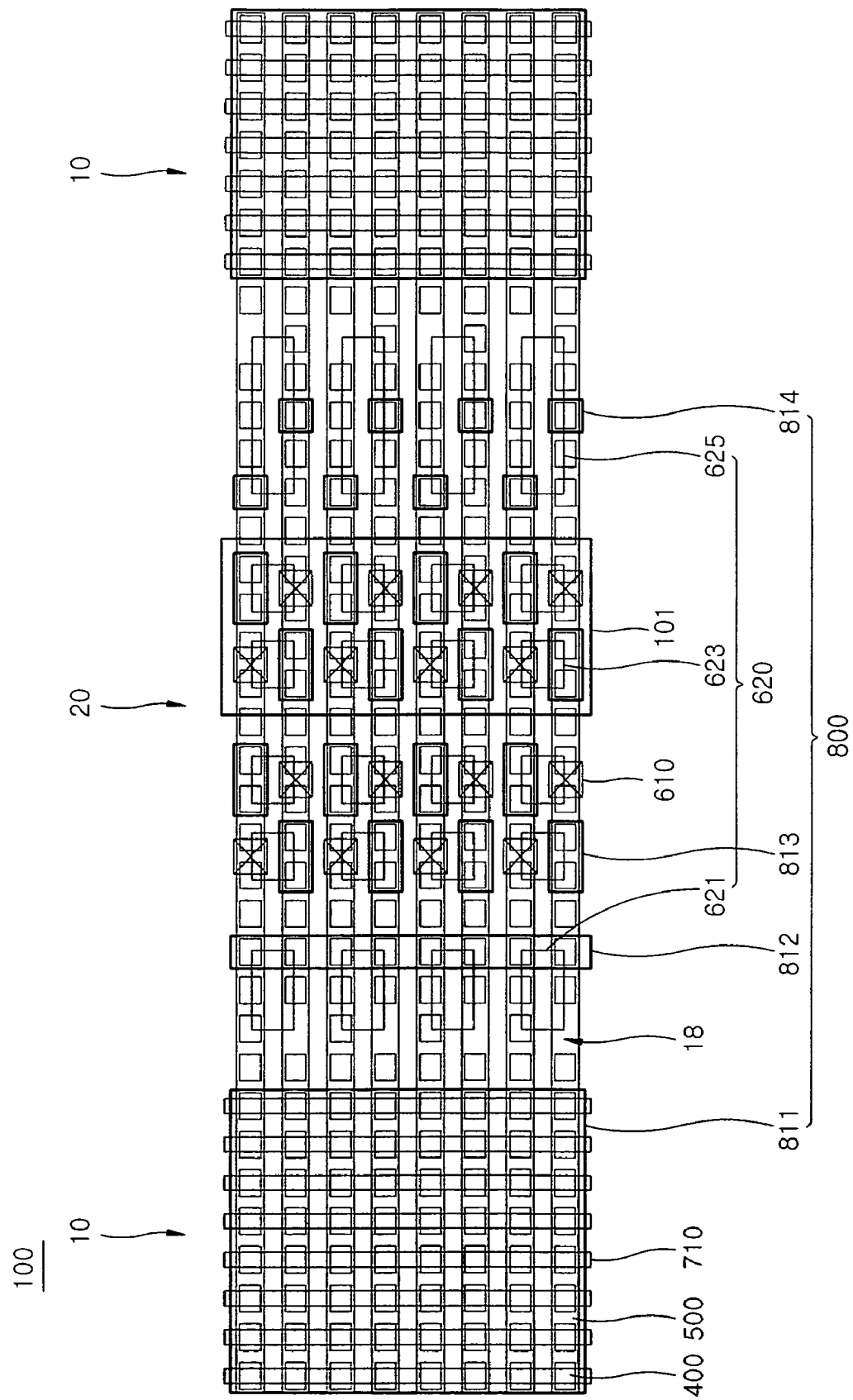
Figure 2F:
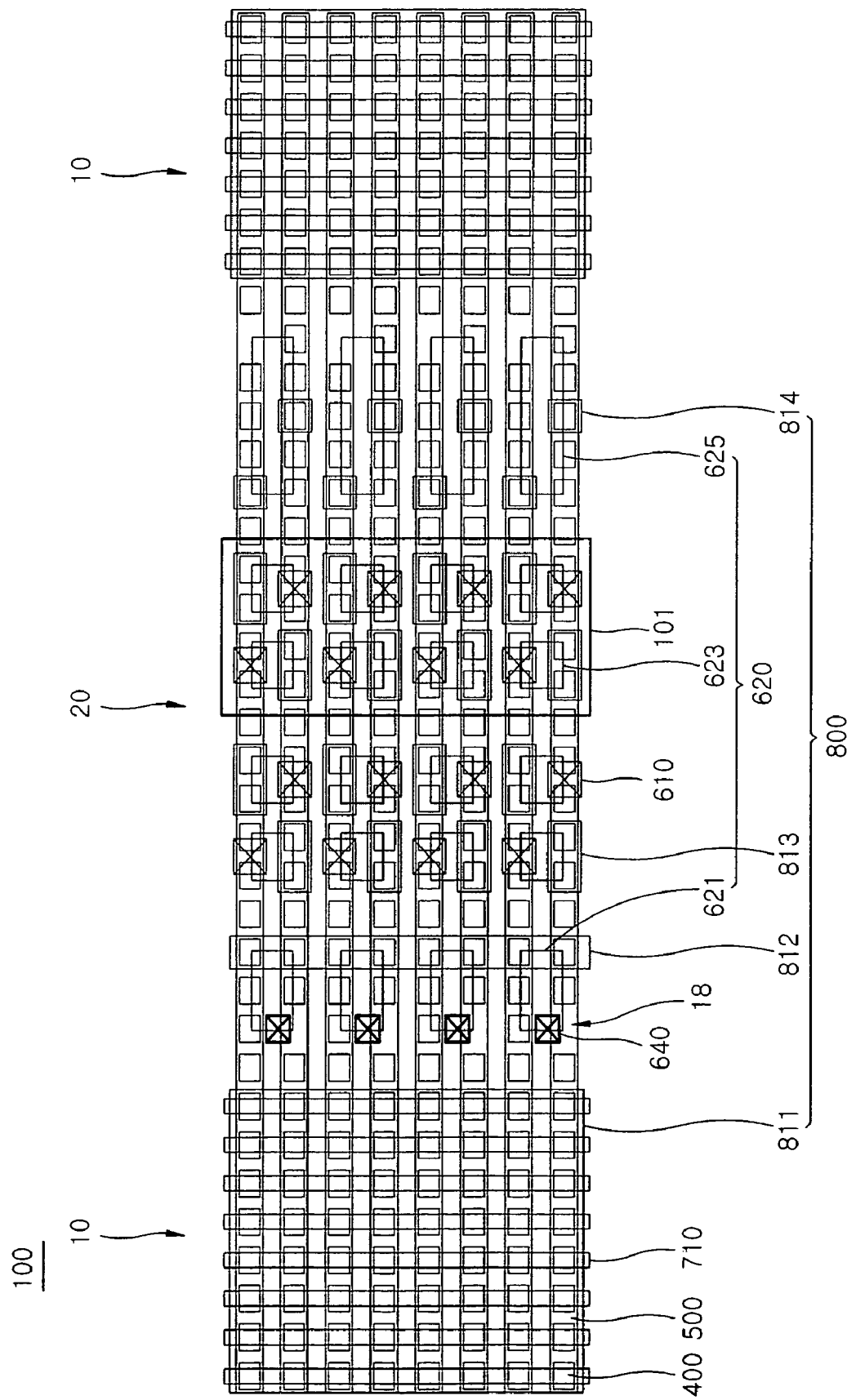
Figure 2G:
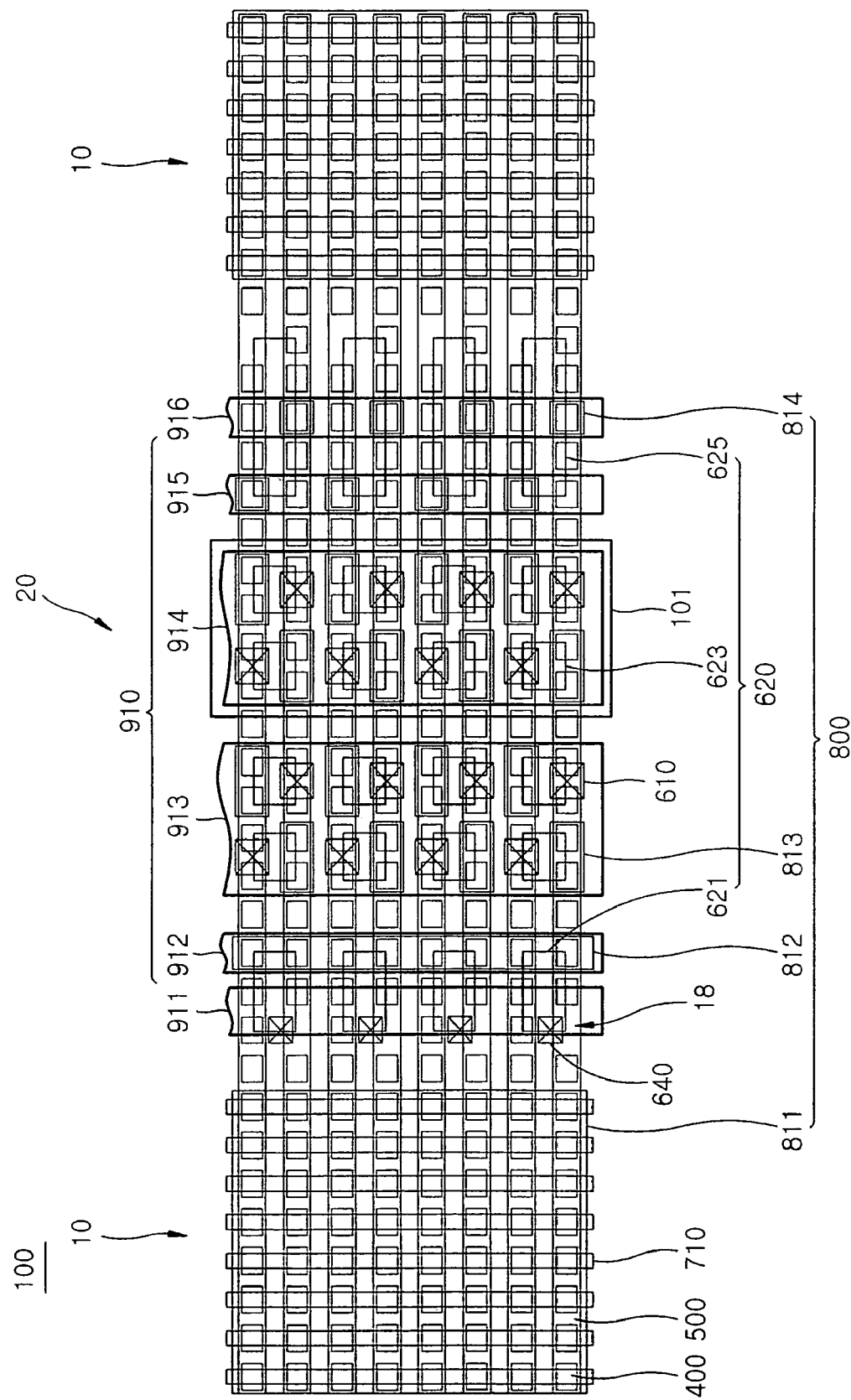
Figure 2H:
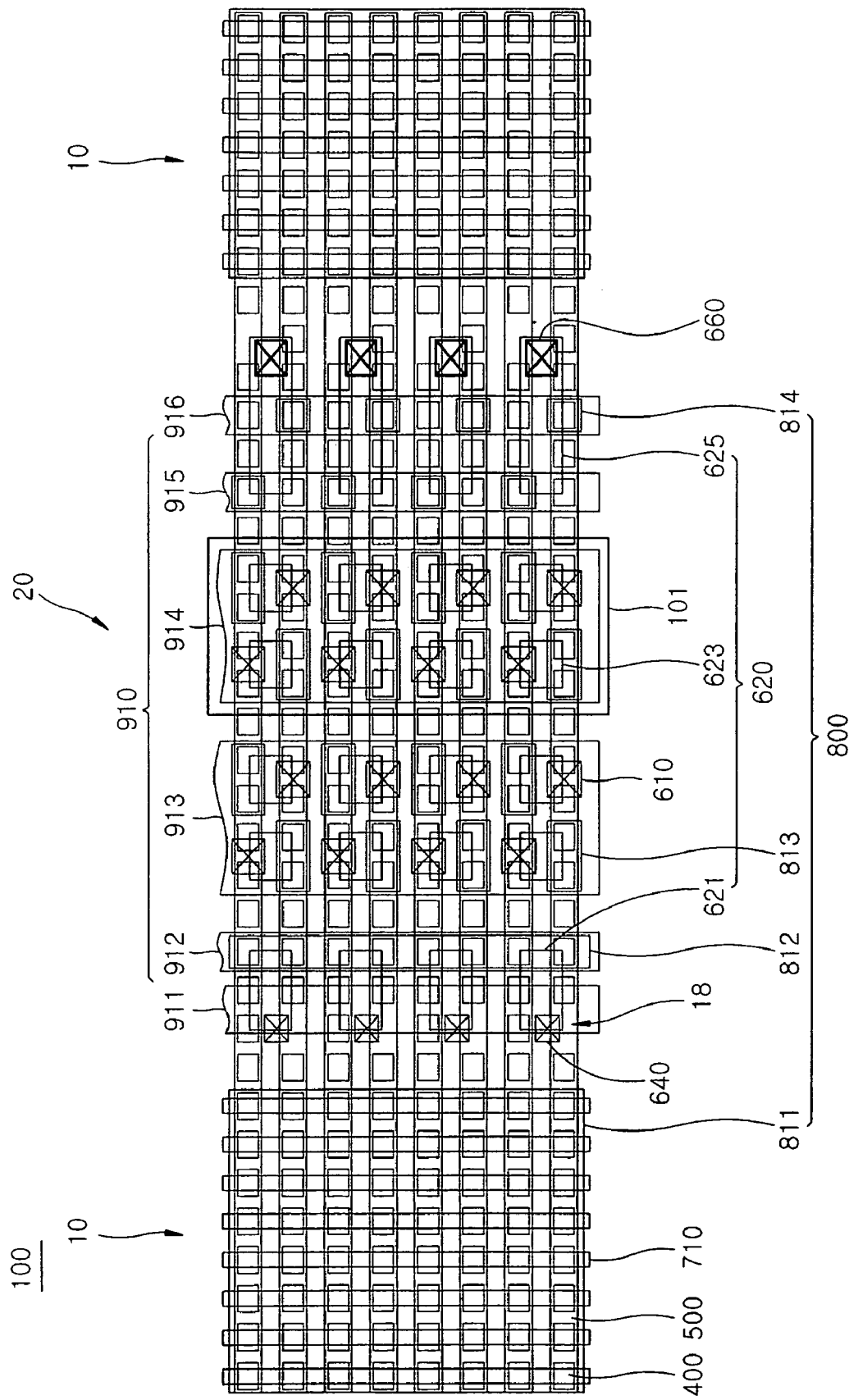
Figure 3A:
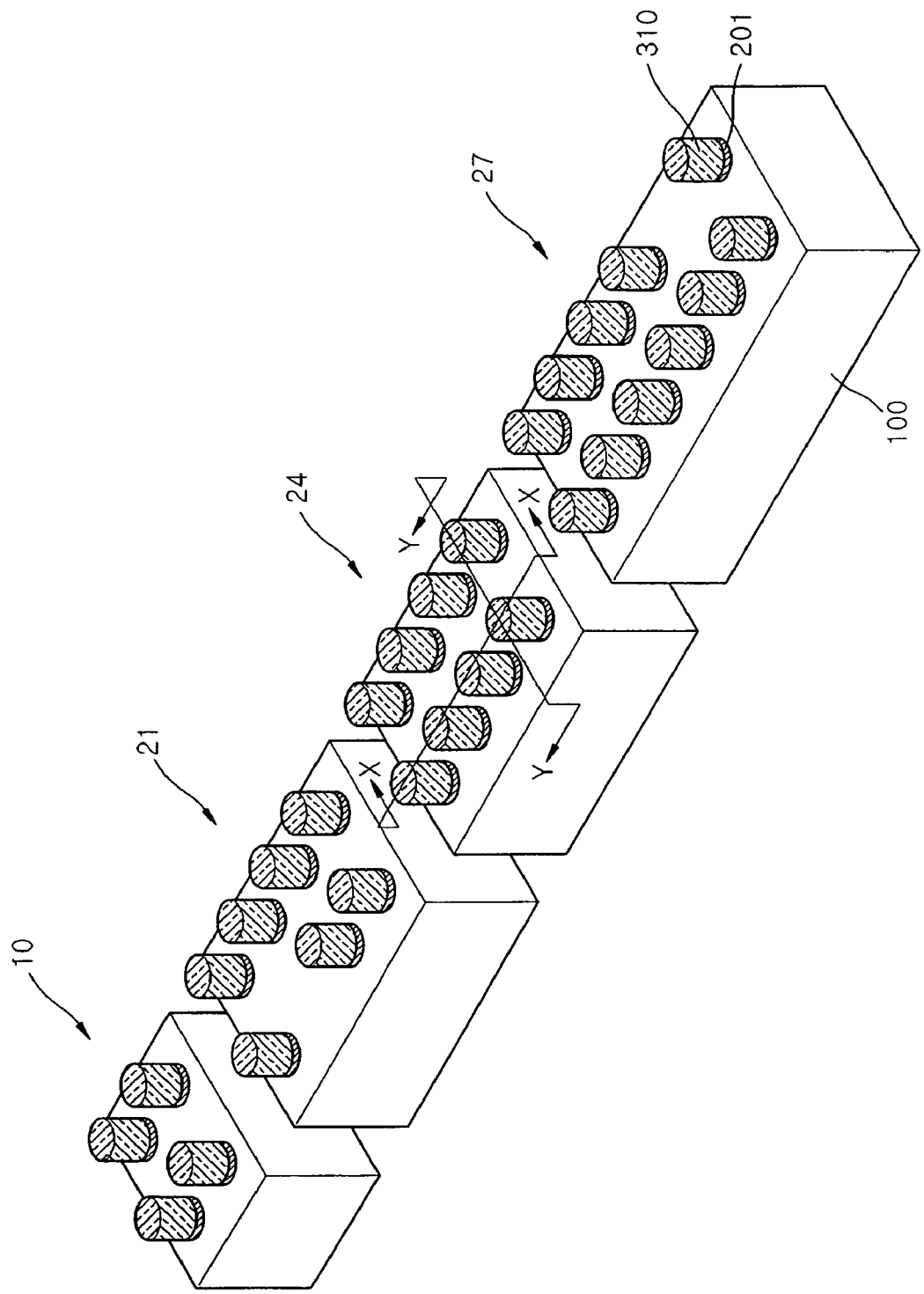
FIGS. 3A through 3N are perspective views illustrating a method of manufacturing the circuit device according to an embodiment of the present invention.
Figure 3N:
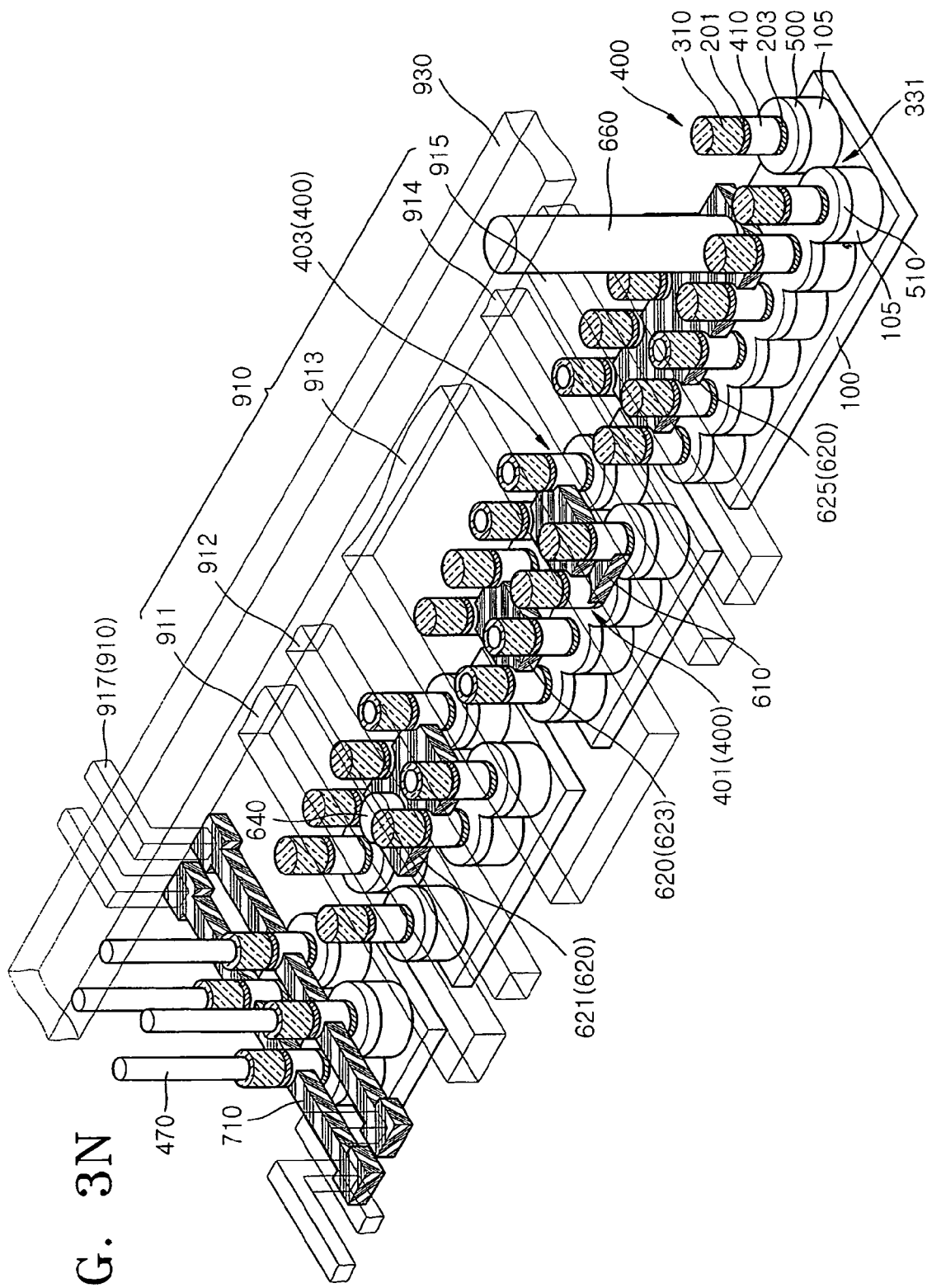
Figure 4A:
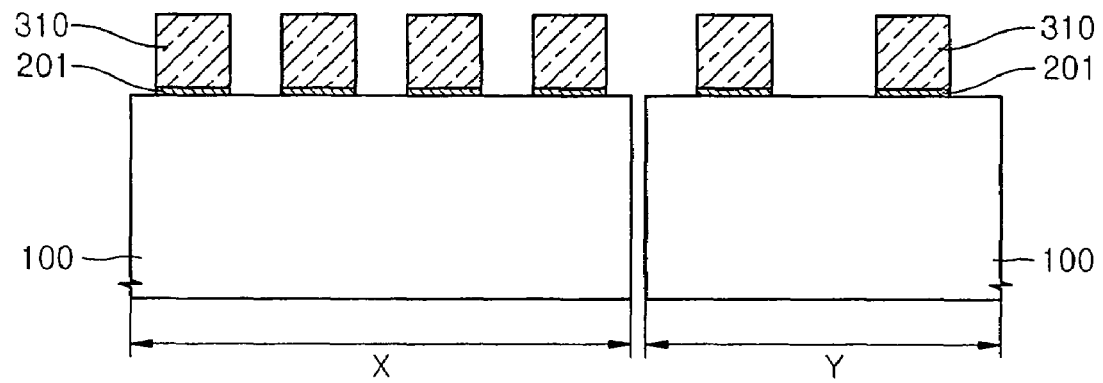
FIGS. 4A through 4Q are sectional views illustrating a method of manufacturing the circuit device according to an embodiment of the present invention.

FIG. 1 is a circuit diagram of a circuit device including vertical transistors connected to buried bitlines according to an embodiment of the present invention. FIGS. 2A through 2I are plan views illustrating a method of manufacturing the circuit device illustrated in FIG. 1, FIGS. 3A through 3N are perspective views illustrating the method, and FIGS. 4A through 4Q are sectional views illustrating the method.

Referring to FIG. 1, the circuit device can include a DRAM device. For example, a memory circuit device can be disposed in a cell region 10 of a semiconductor substrate, and can include a pillar-type vertical transistor 11 with one channel pillar, and one capacitor 13. The capacitor 13 can be a cylinder-type capacitor, and can be disposed over a wordline 15. The transistor 11 can be disposed at an intersection between the wordline 15 and a bitline 17. The bitline 17 can be a buried bitline.

A peripheral circuit region 20 is disposed between the cell regions 10, and peripheral circuit devices such as an equalizer (EQ) 21, a sense amplifier (SA) 24, and a column selector (CSL) 27 are disposed in the peripheral circuit region 20. The SA 24 can include an nSA 25 having n-MOS transistors and a pSA 26 having p-MOS transistors.

Also, lines connected to the above circuit devices, for example, an EQ signal line, a $V_{cc}/2$ line VBL, a $V_{SS}$ line LAB, a $V_{CC}$ line LA, an IO signal line, and a CSL signal line are disposed in the peripheral circuit region 20. The peripheral circuit devices (i.e., EQ, SA and CSL) in the peripheral circuit region can have well-known circuit structures.

Nevertheless, like the memory circuit device in the cell region 10, the peripheral circuit devices (i.e., EQ, SA and CSL) can each include a plurality of pillar-type vertical transistors 12 connected to one another. The peripheral circuit devices and the cell memory circuit devices are connected by the buried bitlines 17.

Each buried bitline 17 has a so-called "relaxed open bitline" structure where a transistor 12 in the peripheral circuit region 20 is connected by the buried bitline 17 to the transistor 11 in any one of the cell regions 10 located at both sides of the peripheral circuit region 20, and a transistor in the opposite cell region 10 is not connected to the buried bitline 17. That is, each buried bitline 17 is connected between the peripheral circuit region 20 and only one of the cell regions 10 located at both sides of the peripheral circuit region 20, but is disconnected at a position 18 between the peripheral circuit region 20 and the opposite cell region 10.

The circuit device illustrated in FIG. 1 can include a transistor structure with a channel pillar, a buried bitline structure, an interconnection contact structure, and a local interconnection line structure.

A method of manufacturing a circuit device of the type illustrated in FIG. 1 will now be described with reference to FIGS. 2 through 4.

Referring to FIG. 2A, transistors can be arranged to form the circuit device illustrated in FIG. 1. The pillar-type transistors 11 and 12 (FIG. 1) are arranged in a matrix throughout the cell region 10 and the peripheral region 20 of the semiconductor substrate 100. Accordingly, a reference numeral 400 can be understood as meaning layouts for transistor pillars used to form the pillar-type transistors 11 and 12. The transistor pillars 400, specifically in the cell region 10, can be arranged to form a matrix for selection of a specific cell transistor 11.

At this point, non-transistor regions 18 where a transistor is not formed are formed in every second row in a column direction at a boundary between the peripheral circuit region 20 and the cell region 10. This is done to make the buried bitline 17 to be formed (FIG. 1) extend only between one cell region 10 and one peripheral circuit region 20 neighboring the cell region 10.

The transistor pillar 400 can be a vertical transistor including a channel pillar, for example, of the type illustrated in FIGS. 3A through 3D and 4A through 4D. FIGS. 4A through 4D are sectional views taken along line X or Y in FIG. 3A.

Referring to FIGS. 3A and 4A together with FIG. 2A, a first gate dielectric layer 201 is formed on a semiconductor substrate 100 and a first hard mask 310 is formed on the first gate dielectric layer 201. The first hard mask 310 is patterned according to the layout of the transistor pillars 400 illustrated in FIG. 2A.

The first gate dielectric layer 201 can be a silicon oxide layer formed by thermal oxidation of a silicon substrate, and can be formed to a thickness of about 50-150Å. After formation of the first gate dielectric layer 201, a layer for the first hard mask 310 is formed of a material having a etch selectivity with respect to the semiconductor substrate 100, for example, silicon, and with respect to the first gate dielectric layer 201. For example, the first hard mask 310 can be formed using a silicon nitride layer or a silicon oxide nitride layer.

A photoresist pattern (not illustrated) for defining a region for transistor pillar 400 is formed on the layer for the first hard mask 310 by photolithography. Accordingly, the layout of the photoresist pattern can correspond with the layout of FIG. 2A. The regions for the transistor pillars 400 can be spaced apart from each other by a distance of about 0.5F (where F is the minimum feature size) in a column direction and by a distance of 1.5F in a row direction, and can be formed to occupy a square area of about 1F.

Thereafter, the layer for the first hard mask 310 and the first gate dielectric layer 201 are selectively etched using the photoresist pattern as an etch mask, thereby forming a structure of the first hard mask 310 and the first gate dielectric layer 201.

Meanwhile, prior to the formation of the first gate dielectric layer 201 and the first hard mask 310, impurities of a different conductivity type than the semiconductor substrate 100 are ion-implanted into a portion 101 (FIG. 2A) of the peripheral region 20 to form a well of the different conductivity type. For example, an n-type well can be formed in a region forming a p-MOSFET.

The reason for this is that since the sense amplifier (SA) is constructed to include a CMOS transistor, a p-MOSFET different from an n-MOSFET forming the cell transistor is required at the construction of the SA. In this ion im plantation process, a pSA transistor region 101 is defined on a p-type semiconductor substrate 100 and n-type impurities such as phosphorus (P) and arsenic (As) are ion-implanted into the pSA transistor region 101, thereby forming an n-type well in the p-type semiconductor substrate 100.

Figure 3B:
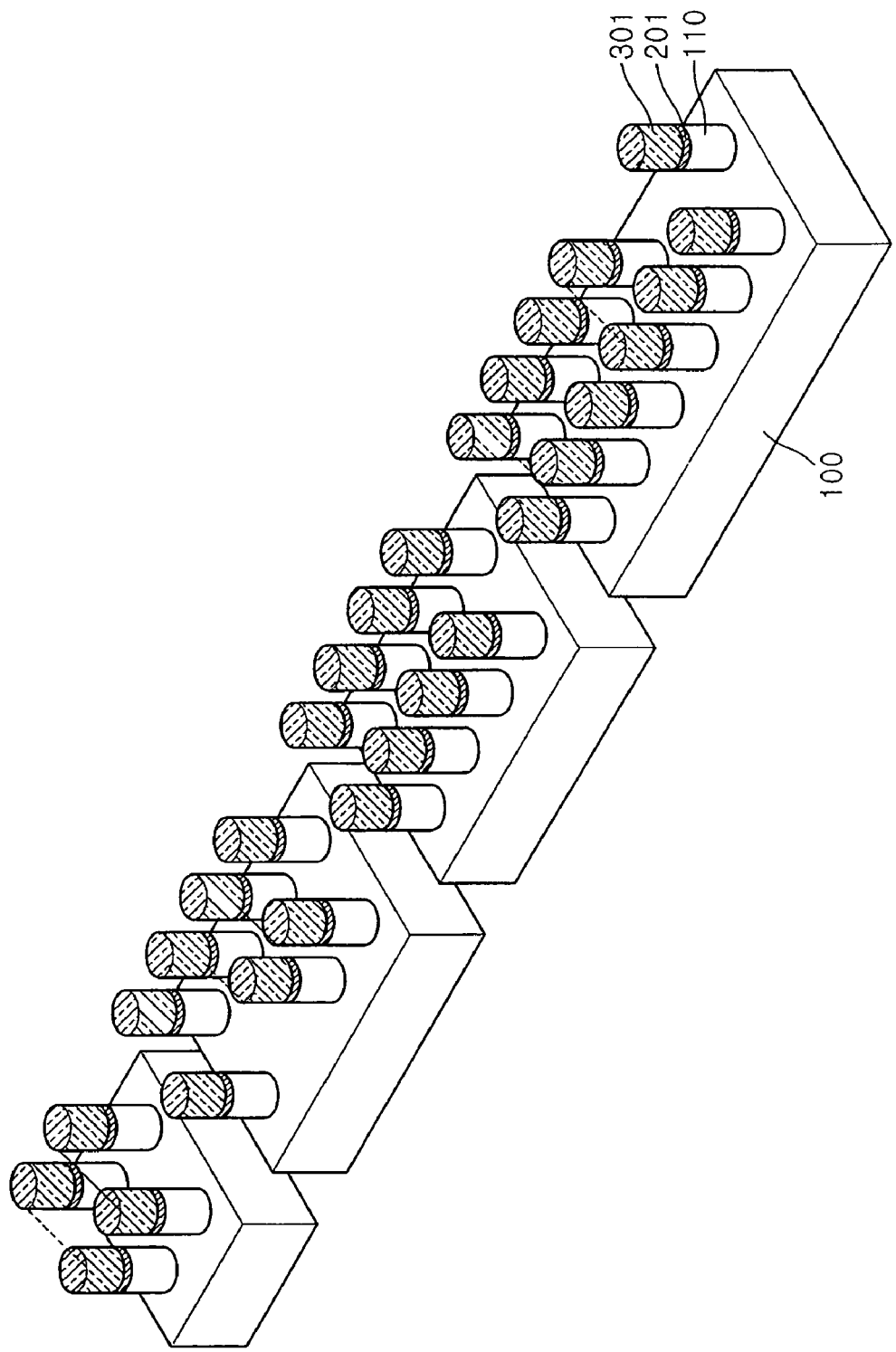
Figure 4B:
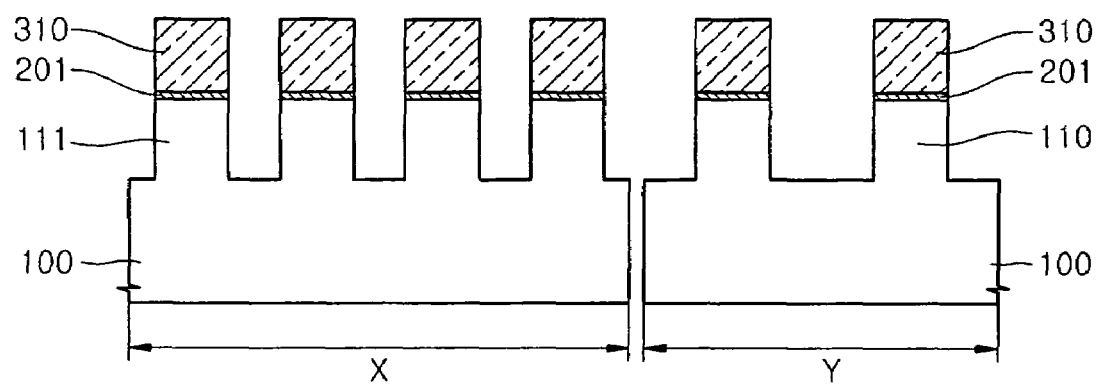

Referring to FIGS. 3B and 4B, an upper portion of the semiconductor substrate 100 is etched and removed using the first hard mask 310 as an etch mask. At this point, the semiconductor substrate 100 is removed to a depth of about 800-1500 Å. By this etching process, an array of self-aligned preliminary pillars 110 is formed on the first hard mask 310.

Since the above etching process can be understood as being performed to form the preliminary pillar 110 as a preliminary pattern for the channel pillar, the etching amount can be determined depending on the height of the channel pillar, that is, the channel length of the vertical transistor.

Figure 3C:
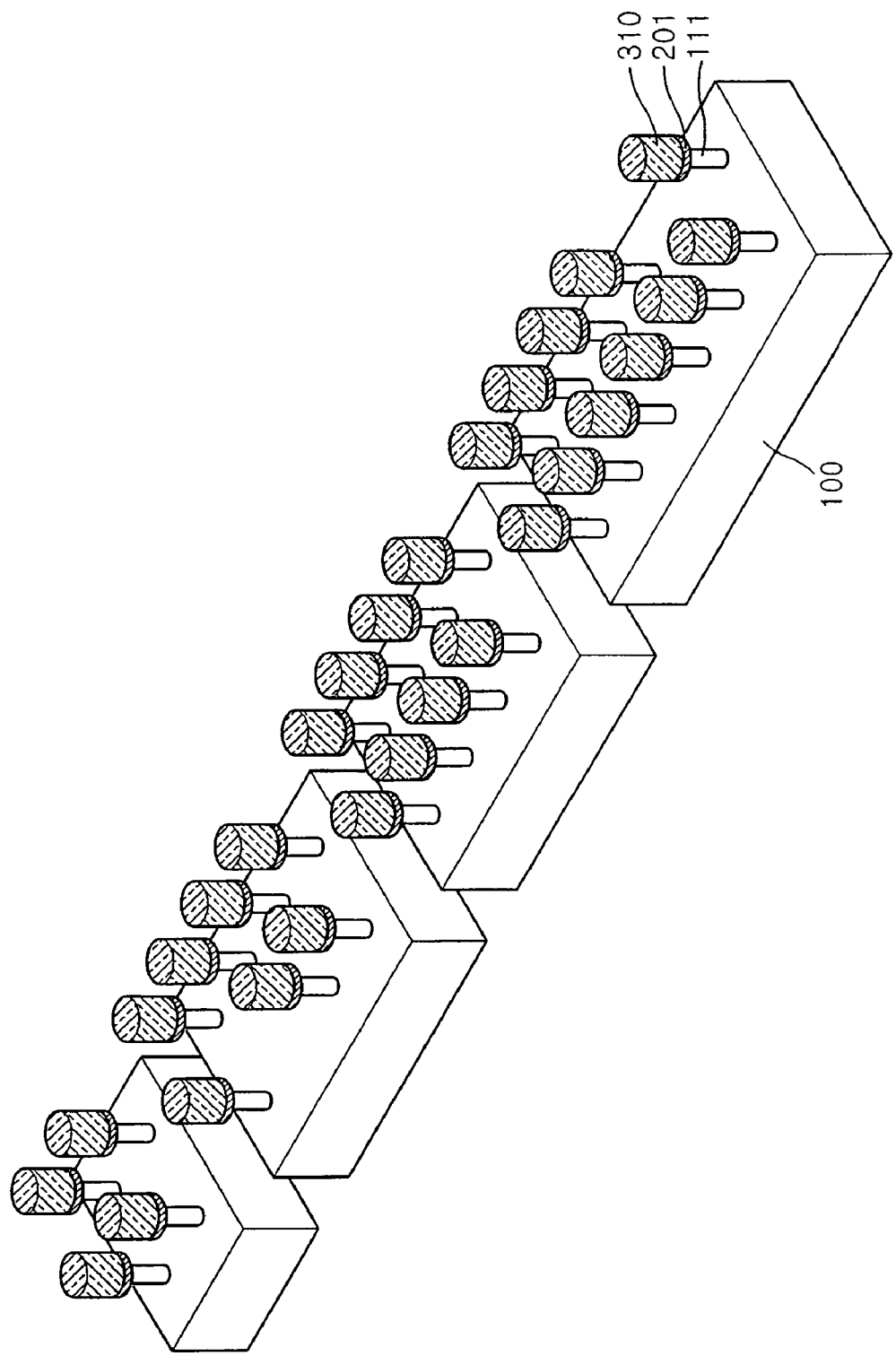
Figure 4C:
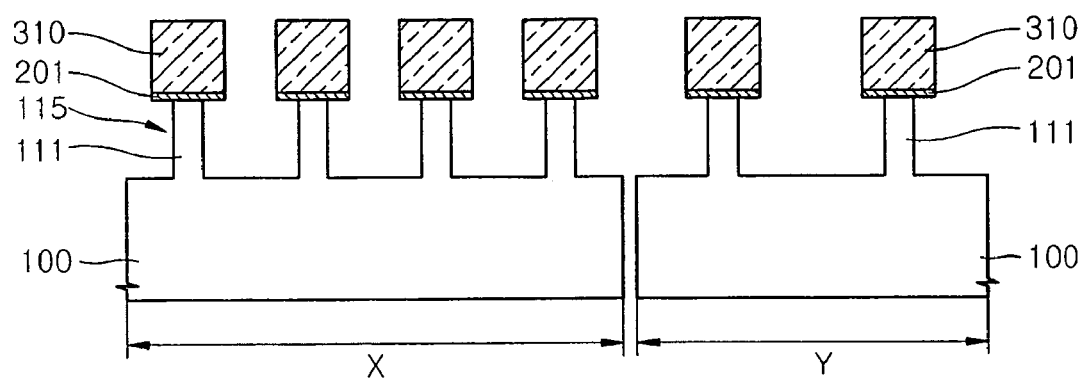

Referring to FIGS. 3C and 4C, an exposed sidewall of the preliminary pillar 110 is selectively recessed (or etched) with respect to the first hard mask 310 and the first gate dielectric layer 201 to reduce the diameter of the preliminary pillar 110, thereby forming a channel pillar that is to be used as a channel of a transistor. This etching process can be an isotropic etching process and can be performed to etch the surface of the preliminary pillar 110 to reduce it in thickness by about 150-500 Å.

Accordingly, a channel pillar 111 having a recess groove 115 and a smaller diameter than the first hard mask 310 is formed between the bottom of the first hard mask 310 and the upper surface of the semiconductor substrate 100.

Figure 3D:
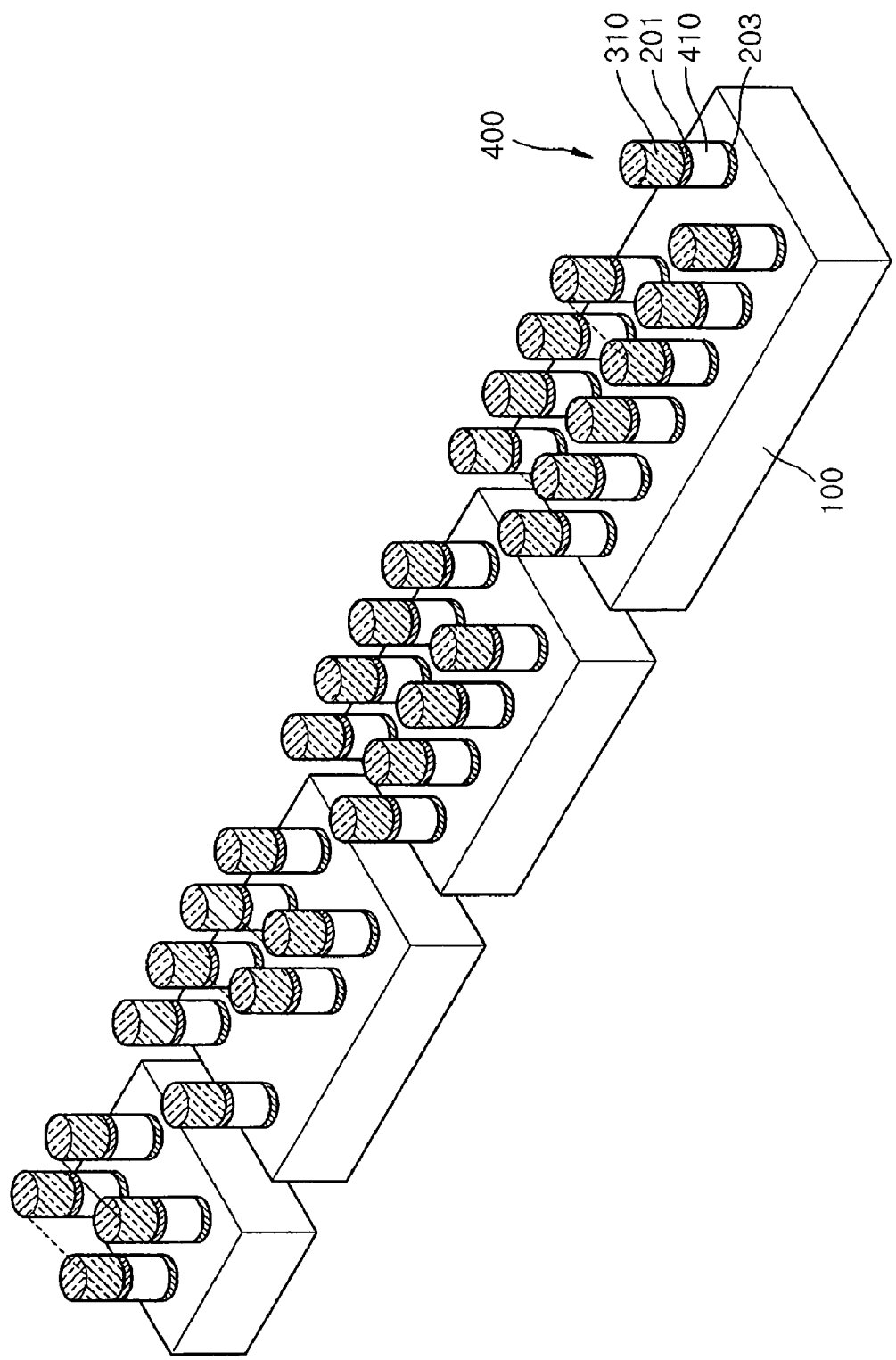
Figure 4D:
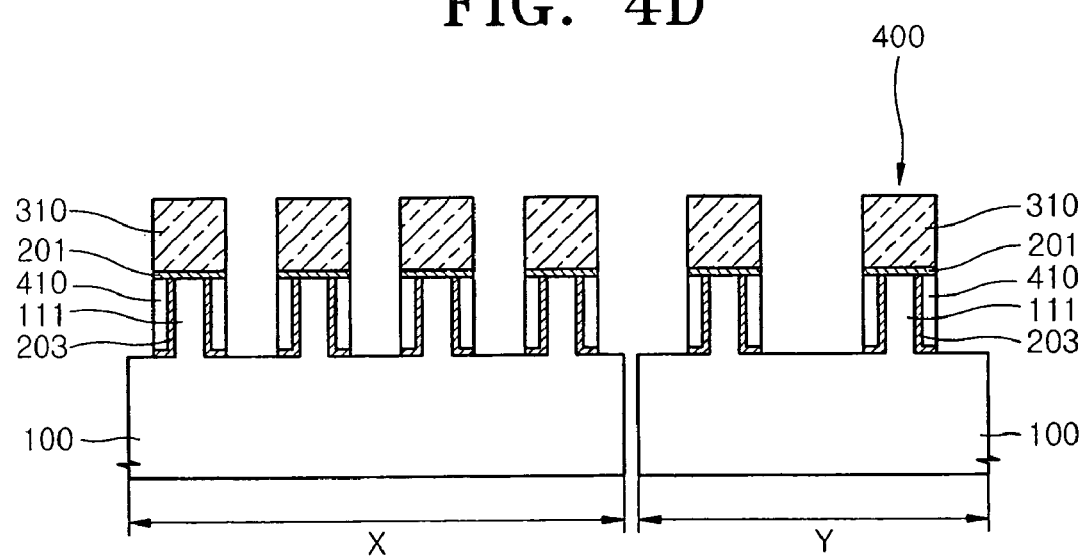

Referring to FIGS. 3D and 4D, a second gate dielectric layer 203 is formed to extend to the surface of the channel pillar 111 and the recessed surface of the semiconductor substrate 100 connected to the channel pillar 111. The second gate dielectric layer 203 can be formed by deposition or oxidation, and can be formed of one selected from the group consisting of a silicon oxide ($SiO_2$) layer, a hafnium oxide ($HfO_2$) layer, a tantalum oxide ($Ta_2O_5$) layer, and an oxide/nitride/oxide(ONO) layer.

The recess groove 115 of the channel pillar 111 is filled with a gate electrode material to form a gate electrode 410 on the second gate dielectric layer 203. For example, a gate electrode material (for example, a conductive layer a polysilicon layer doped with n-type impurities and a silicon germanium layer or a polysilicon layer doped with p-type impurities) is deposited on the semiconductor substrate 100 on which the second gate dielectric layer 203 has been formed. The gate electrode material is deposited to a sufficient thickness so as to fill the recess groove 115.

Thereafter, using the first hard mask 310 as an etch mask, the resulting gate electrode material layer is anisotropically etched back to expose the surface of the semiconductor substrate 100. Consequently, the gate electrode 410 filling the recess groove 115 is formed to substantially surround the channel pillar 111. Accordingly, the gate electrode 410 can be considered as a cylindrical pillar surrounding the channel pillar 111. The gate electrode 410 and the semiconductor substrate 100 are isolated from each other by the second gate dielectric layer 203 extending between an interface of the gate electrode 410 and the semiconductor substrate 100.

Consequently, a transistor pillar 400 is formed to include the channel pillar 111 and the gate electrode 410. Thereafter, a process of forming a buried bitline and source/drain regions of a transistor can be performed.

FIG. 2B is a plan view illustrating the layout of buried bitlines, and FIGS. 3E through 3G and 4E through 4G are perspective or sectional views illustrating a process of forming the buried bitlines.

Figure 3E:
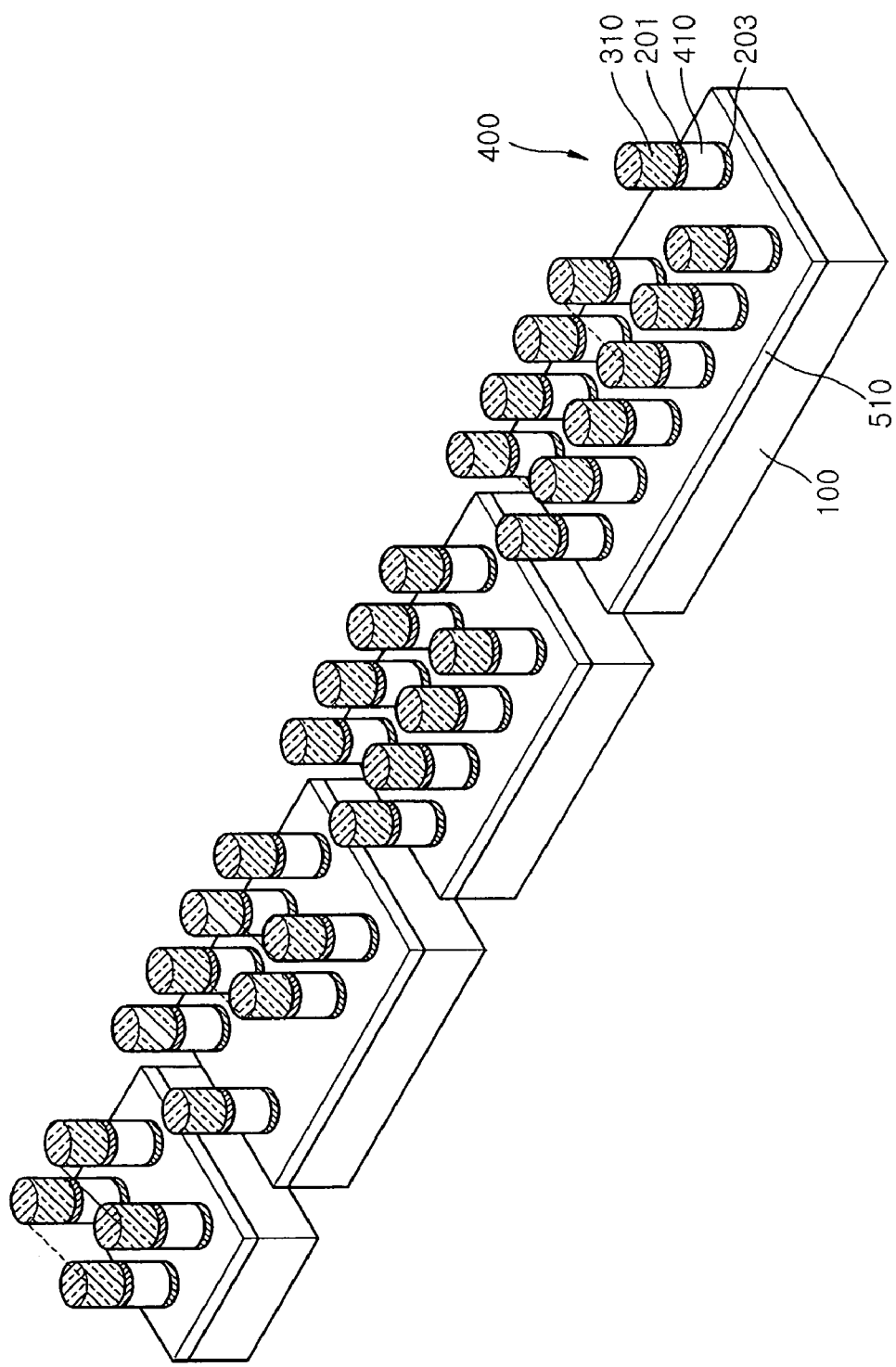
Figure 4E:
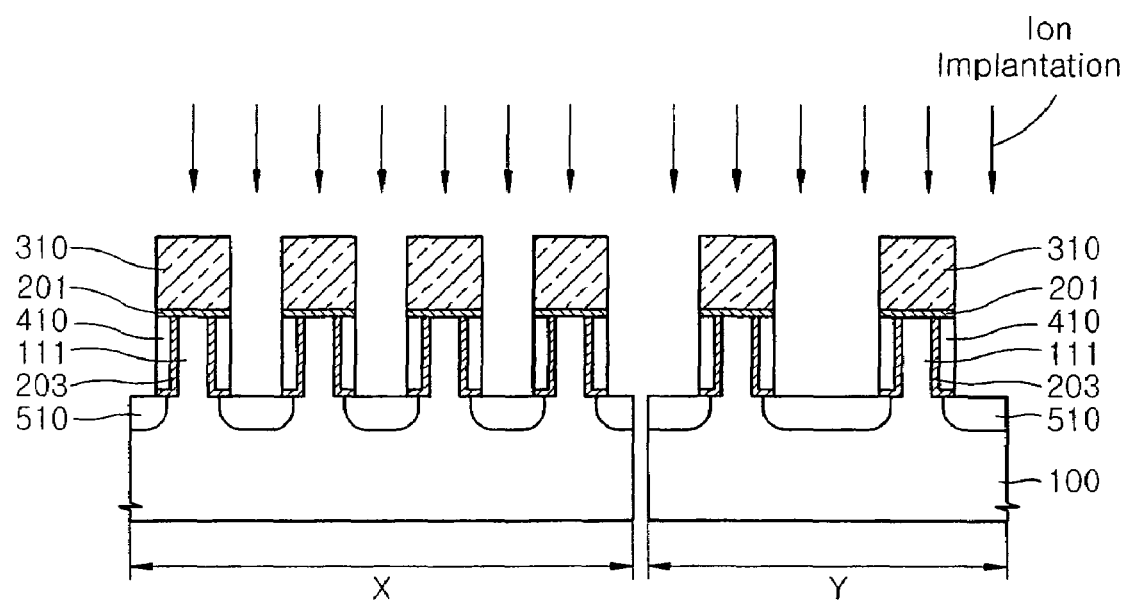

Referring to FIGS. 3E and 4E together with FIG. 2B, a first ion implantation process is performed to implant impurities for formation of a junction region (for example, phosphorus ions (31P) or arsenic ions (75As)) into a portion of the semiconductor substrate 100 exposed between the first hard masks 310, thereby forming an impurity region 510 for a first (bottom) source/drain region as a first junction region. The impurity region 510 can be used as a bottom junction region located at the bottom of the channel pillar 111, that is, the first source/drain region, and can be considered as a region that can be defined by the buried bitlines 500 (FIG. 2).

At this point, sine a p-MOS transistor is to be formed in the pSA transistor region 101, an ion implantation mask used in the first ion implantation process, for example, a photoresist pattern (not illustrated) is formed to cover the pSA transistor region 101. Thereafter, using a second ion implantation mask such as a second photoresist pattern exposing the pSA transistor region, a second ion implantation process is performed to implant impurities for first (bottom) source/drain of the p-MOS transistor. Here, the impurities can be boron (B).

Consequently, the impurity region having a substantially opposite conductivity to that of the other regions can be formed in the semiconductor region 100 exposed to the first hard mask 310 in the pSA transistor region 101. Accordingly, the impurity region 510 in FIGS. 3E and 4E can be understood as representing the entire region including the n-type impurity region and the p-type impurity region.

Figure 3F:
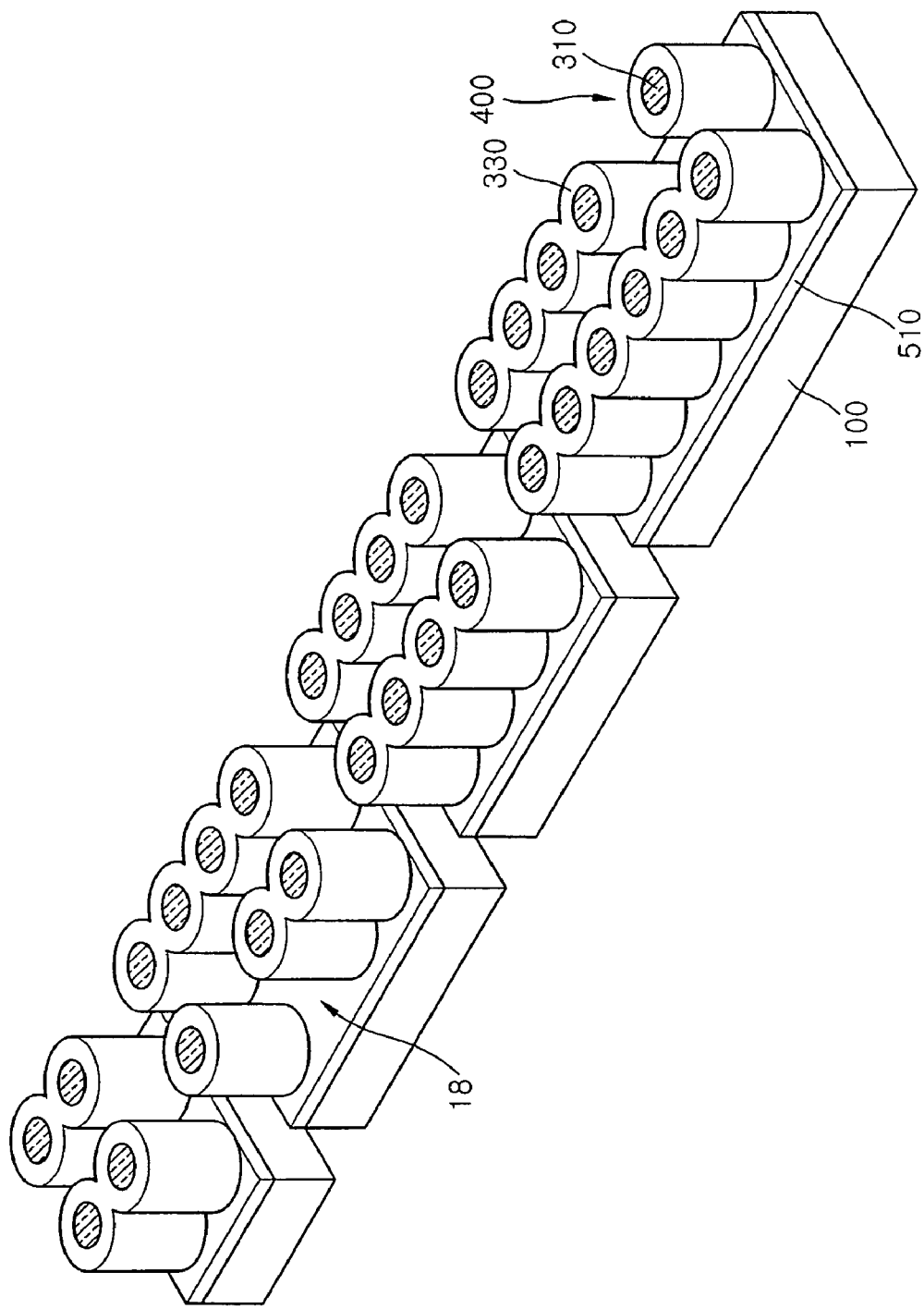
Figure 4F:
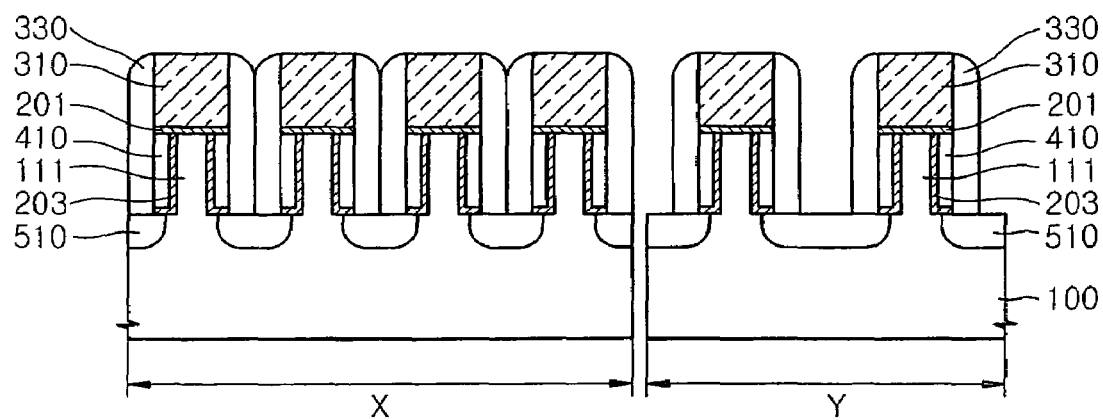

Referring to FIGS. 3F and 4F, the impurity region 510 is set to the buried bitline 500 extending in a row direction as illustrated in FIG. 2B, thereby forming a second hard mask 330 for dividing the array of the channel pillars 111 into column arrays.

Specifically, an insulation layer is formed on the resulting structure of the semiconductor substrate 100. The insulation layer can be formed to a sufficient thickness so as to fill a gap between the first hard masks 310 fully in a row direction (i.e., an X-axis direction), but partially in a column direction (i.e., a Y-axis direction).

The insulation layer can be a layer containing, for example, a silicon oxide layer. Thereafter, the insulation layer is anisotropically etched to form a sidewall-spacer-type second hard mask 330 that exposes the upper surface of the first hard mask 310 and the surface of the semiconductor substrate 100 between the first hard masks 310 in the column direction.

As illustrated in FIG 3F, in the column direction, the second hard mask 330 is formed in the shape of a spacer attached to the sidewalls of the gate electrode 410 and the first hard mask 310. In the row direction, the second hard mask 330 is formed to fill the gap between the first hard masks 310 and thus cover the semiconductor substrate 100 thereunder. At this point, since the channel pillar 111 is not formed in the non-transistor region, the second hard mask 330 does not extend into the non-transistor region 18 in the row direction. Accordingly, the surface of the semiconductor substrate 100 remains exposed in the non-transistor region 18.

The second hard mask 330 can be formed of an insulative material such as a silicon nitride. More preferably, the second hard mask 330 is formed of a material having an etch selectivity with respect to the first hard mask 310. This case is more favorable so that the first hard mask 310 can be retained at the time of subsequent selective etching of the second hard mask 330.

Figure 3G:
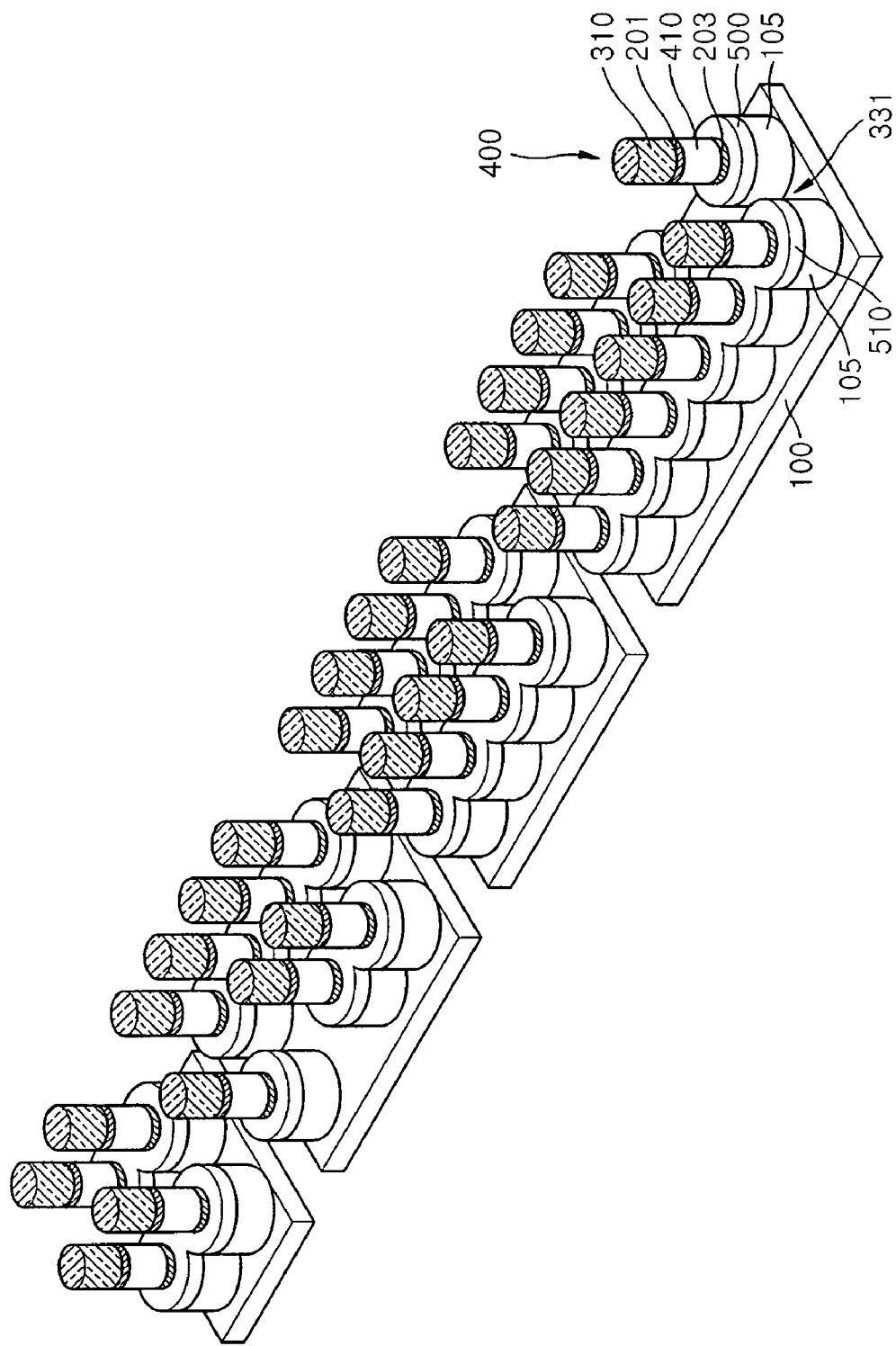
Figure 4G:
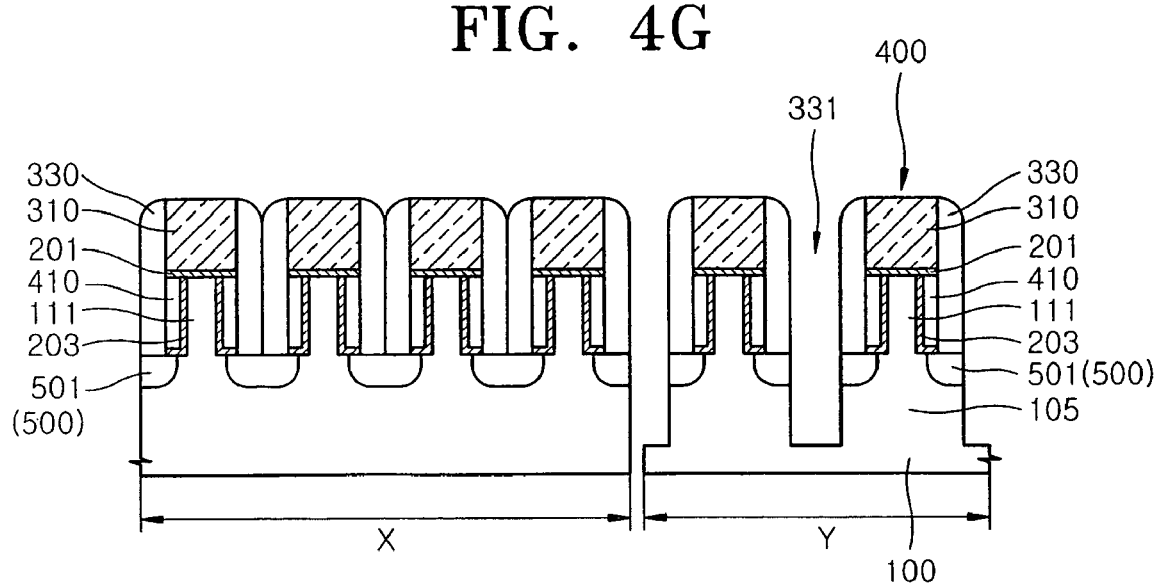

Referring to FIGS. 3G and 4G, using the first and second hard masks 310 and 330 at an etch mask, the exposed portion of the semiconductor substrate 100 is selectively etched to form trench grooves 331 that divide the array of transistors (i.e., channel pillars 111) into row arrays. The trench groove 331 is preferably formed to such a depth as to divide the impurity region 510 (Junction region) on the semiconductor substrate 100 into row arrays. The depth of the trench groove 331 can be about 1500-2000 Å.

Consequently, a self-aligned buried bitline 500 is formed at the first and second hard masks 310 and 330. The buried bitline 500 is formed to connect first (bottom) source/drain regions 501 (junction region) formed on the semiconductor substrate 100 under the channel pillars 111.

The first source/drain regions 501 comprise ring or round-shaped diffusion regions on the semiconductor substrate 100 under the channel pillars 111. Therefore, the buried bitline 500 can be considered as a chain of the first source/drain regions connected along the row array. Accordingly, the buried bitline 500 can be considered an impurity region including the first source/drain regions 501.

Thereafter, the second hard mask 330 is selectively removed to expose the buried bitline 500 to the gate electrode 410. Accordingly, a transistor pillar 400 constituting a substantially vertical transistor is formed.

As illustrated in FIG. 2B, the buried bitline 500 is disconnected in the non-transistor region 18 between the cell region 10 and the peripheral circuit region 20. Accordingly, the buried bitline 500 is formed in an open bitline structure as illustrated in FIG. 1.

The row arrays are substantially separated by the formed trench groove 331. Accordingly, a bottom active region 105 is formed between the trench grooves 331. Therefore, the bottom active region 105 can be considered as a region that is self-aligned with a region from which the buried bitline 500 is extended.

To enhance the device isolation effect by the trench grooves 331, channel stop impurity ions can be further implanted into the surface of the semiconductor substrate 100 exposed at the bottom of the trench groove 331.

After the formation of the buried bitline 500, a wordline can be formed to be connected to the surface of the gate electrode 410 exposed by the removal of the second hard mask 330.

Although the cell region 10 does not require a circuit structure for connecting between the gate electrode 410 and the buried bitline 500, the peripheral circuit region 20 does require a circuit structure for connecting a plurality of transistors for the peripheral circuit devices (e.g., EQ, SA, and CSL).

The construction of the above circuit devices requires the formation of an interconnection contact for electrical connection of the gate electrode 410 of a specific transistor to the buried bitline 500, a local interconnection line for local connection of the gate electrodes 410, and interconnection contacts for connection of the local interconnection line to the gate electrode 410 and/or to the buried bitline 500.

The interconnection contacts and the interconnection lines can be simultaneously formed during the formation of the wordline in the cell region 10. Some of the interconnection contacts can be formed such that they are connected to the interconnection lines that are simultaneously formed before or after the formation of the wordline.

FIG. 2C is a plan view illustrating a layout for a first interconnection contact for electrically connecting gate electrodes of two neighboring transistors and electrically connecting the buried bitline and the gate electrode for construction of the sense amplifier (SA), and FIG. 2D is a plan view illustrating a layout for a first local interconnection line for connecting the wordline and the neighboring gate electrode. FIGS. 3H, 3I and 4H through 4N are perspective or sectional views illustrating a process of forming the interconnection contact and the local interconnection line during the formation of the wordline.

Figure 3H:
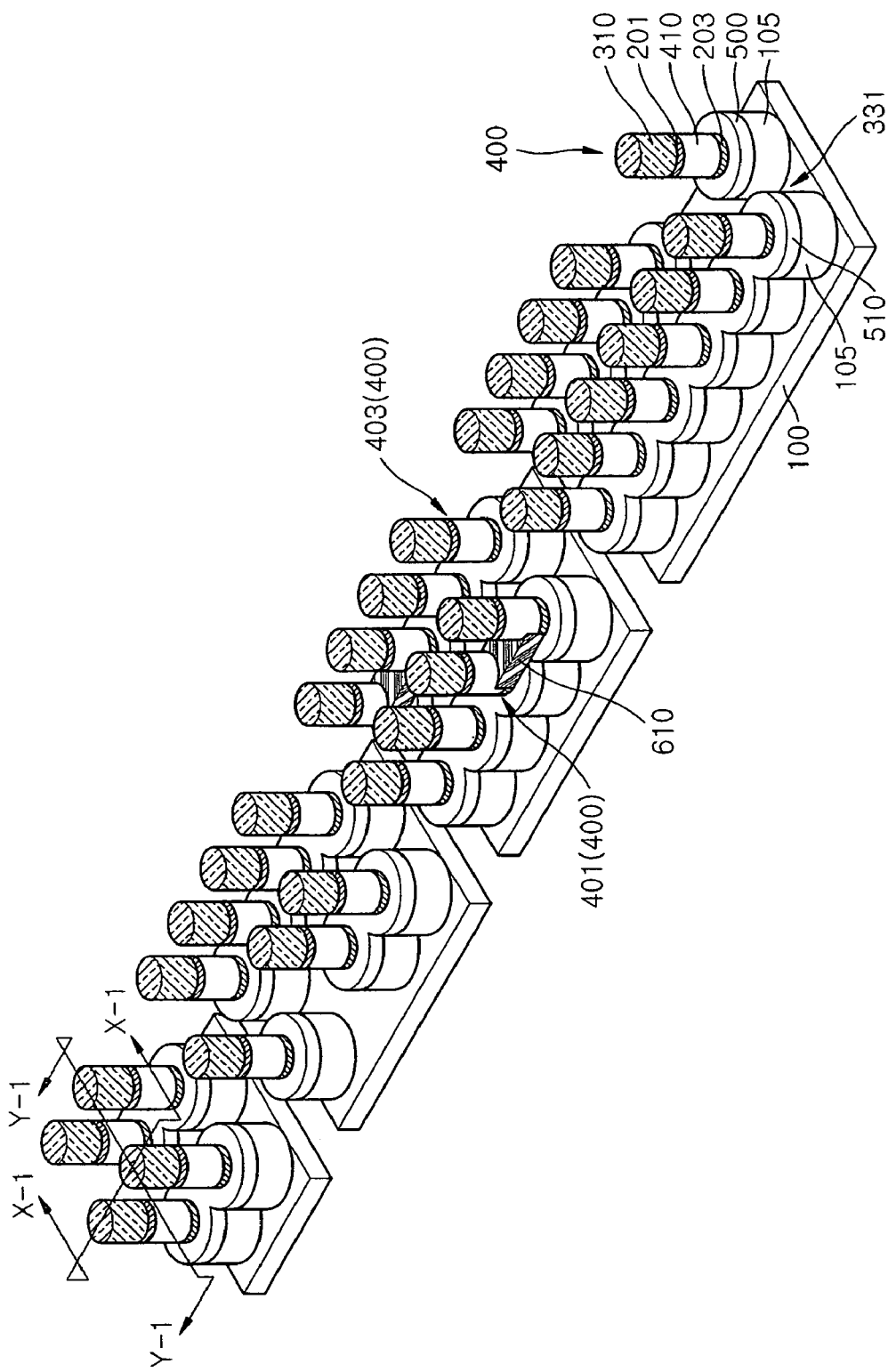

Referring to FIGS. 2C and 3H, the construction of the sense amplifier 24 (see FIG. 1) first requires the formation of a node for electrically connecting the buried bitline 500 and the gate electrode 410 of the channel pillar type transistor.

CMOS transistors can constitute a balanced flip-flop circuit to function as the sense amplifier 24. As illustrated in FIG. 1, with reference to FIG. 3H, the gate electrode 410 of the nSA transistor (or pSA transistor) is electrically connected to one of the two neighboring bitlines 500, and the other gate electrode 410 of the nSA transistor is electrically connected to the other one of the neighboring bitlines 500.

The source regions of two nSA transistors are commonly connected to the LAB signal line (or the LA signal line).

At this point, a first interconnection contact 610 is formed to electrically connect the buried bitline 500 and the gate electrode 410 of the SA transistor.

Referring to FIG. 3H, the first interconnection contact 610 can be disposed in the gap between the gate electrodes 410 attached to the sidewall of the channel pillar 111, and can be formed of a contact that extends to the buried bitline 500 at about half the height of the gate electrode 410.

The transistor pillar 400 including the gate electrode 410 directly connected to the first interconnection contact 610 can directly constitute a SA circuit, or can be considered as a pillar structure constituting a dummy pillar 401 or a dummy transistor.

The introduction of the dummy pillar 401 is favorable because it can prevent the occurrence of a step difference during the formation of the transistor pillars disposed compactly in the cell region 10. Also, a circuit is more favorably constructed in the peripheral region 20 because a pillar 403 at a favorable position can be selected as a pillar to be actually used as a transistor.

Figure 3I:
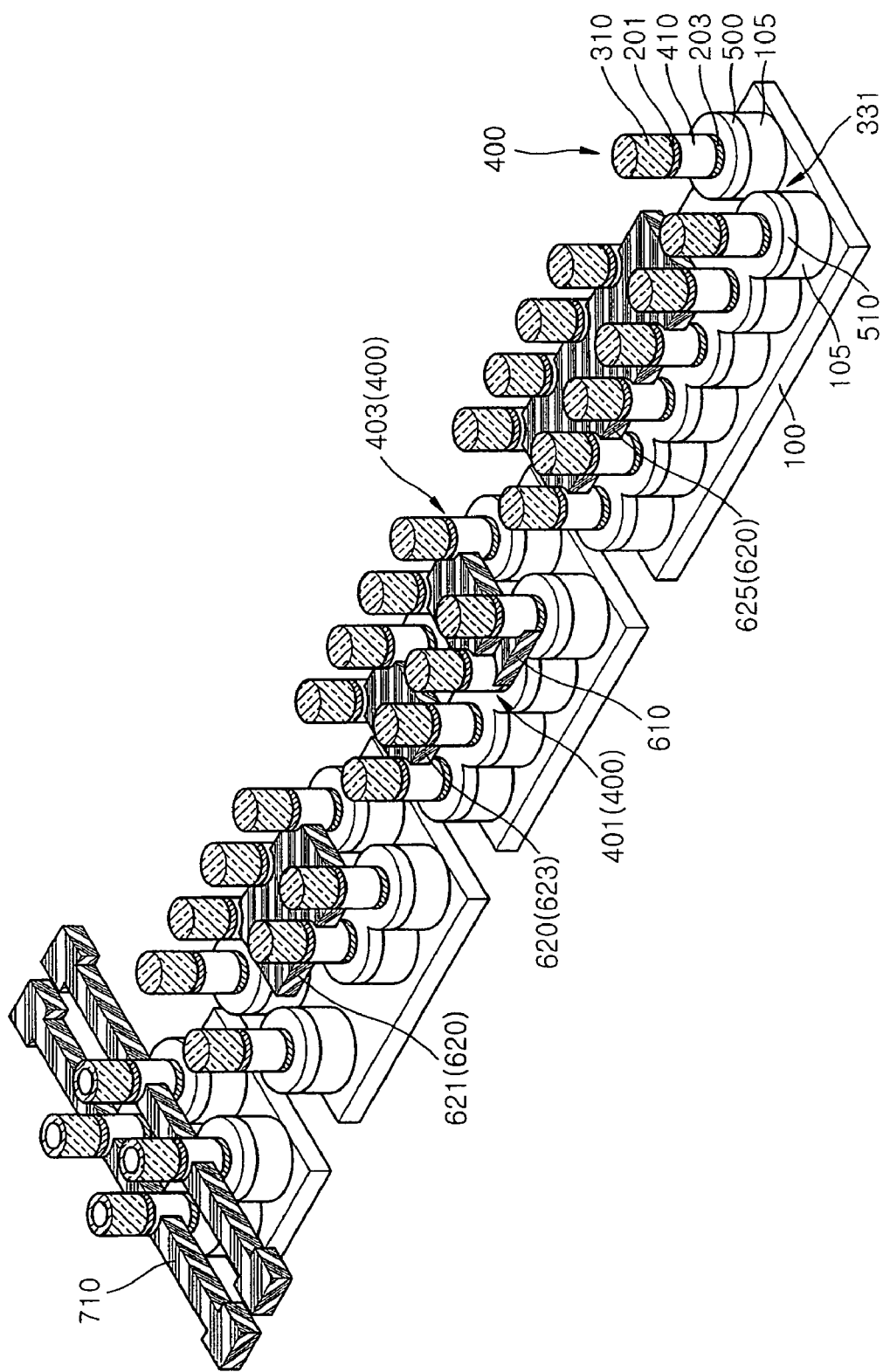

Referring to FIGS. 2D and 3I, a first local interconnection line 620 can be formed to connect the first interconnection contact 610 between the dummy pillars to the gate electrode 410 of the real transistor pillar 403. The first local interconnection line 620 is formed together with a word line 710 connected to the gate electrode 410 of the transistor pillar 400 in the cell region 10. Accordingly, the first local interconnection line 620 is formed at the same level (height) as the wordline 710. Therefore, the first local interconnection line 620 can be considered as a gate electrode extension pad for electrical connection to the gate electrode 410.

The first local interconnection line 620 is connected to the first interconnection contact 610 electrically connected to one of the two neighboring buried bitlines 500, thereby connecting the first interconnection contact 610 electrically to the gate electrode 410 of the transistor pillar 403 formed on the other of the two neighboring buried bitlines 500. Consequently, the gate electrode 410 of the transistor pillar 403 constituting an actual circuit is connected to the buried bitline 500 of a different row.

In the same manner that the first local interconnection line 620 can be formed to constitute the SA circuit, a first local interconnection line 621 can be formed to constitute an EQ circuit. Also, a first local interconnection line 625 can be formed to constitute a CSL circuit. At this point, since the dummy terminal 401 is disposed between the transistor pillars 403 for construction of an actual circuit, the first local interconnection line can be formed in a pattern with a relatively large line width. Accordingly, it is possible to meet the device fabrication process margin.

Moreover, two or more transistor pillars 400 can be connected to one first local interconnection line 620. This can be considered as a circuit structure where gate electrodes (also, drains and sources) of the transistors are connected commonly to the first local interconnection line 620. In this case, the first local interconnection line can be formed in a pattern having a relatively larger line width.

The first local interconnection line 620 and the wordline 710 can be simultaneously formed in the same process. Also, the first interconnection contact 610 can be formed before or after the formation of the wordline 710. Alternatively, the first interconnection contact 610 can be formed simultaneously with the wordline 710 by also forming a contact hole for the first interconnection contact 610 during the formation of the wordline 710.

Figure 4H:
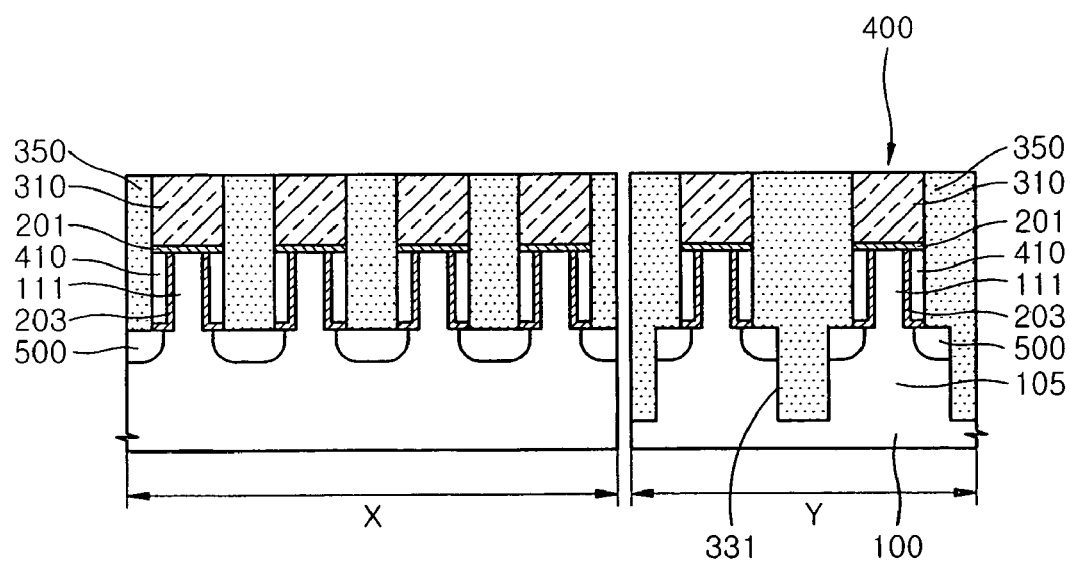

Referring to FIG. 4H, a first insulation layer 350 is formed to fill gaps between the transistor pillars 400 formed as illustrated in FIGS. 3G and 4G. The first insulation layer 350 can be formed of at least a silicon oxide layer to a thickness of about 5000-7000 Å. The first insulation layer 350 can be understood as functioning substantially as a device isolation region or an inter-device insulating layer that fills the trench groove 331 and a gap between the transistor pillars 400.

Thereafter, the first insulation layer 350 is polished and planarized to the level of the first hard mask 310. This planarization can be performed through a full polishing process using chemical mechanical polishing (CMP).

Figure 4I:
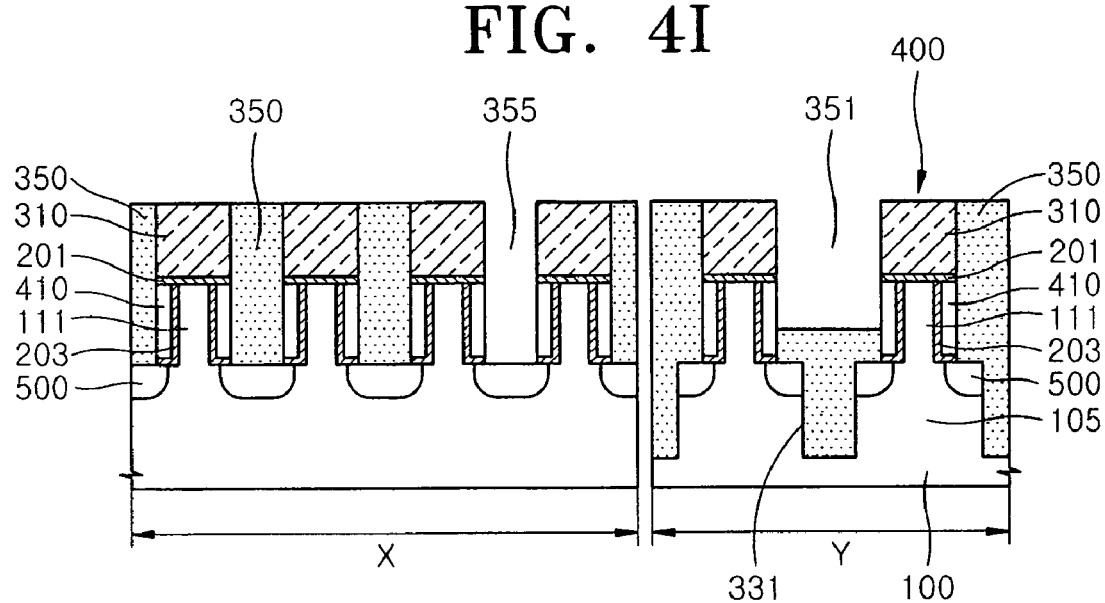
Figure 4J:
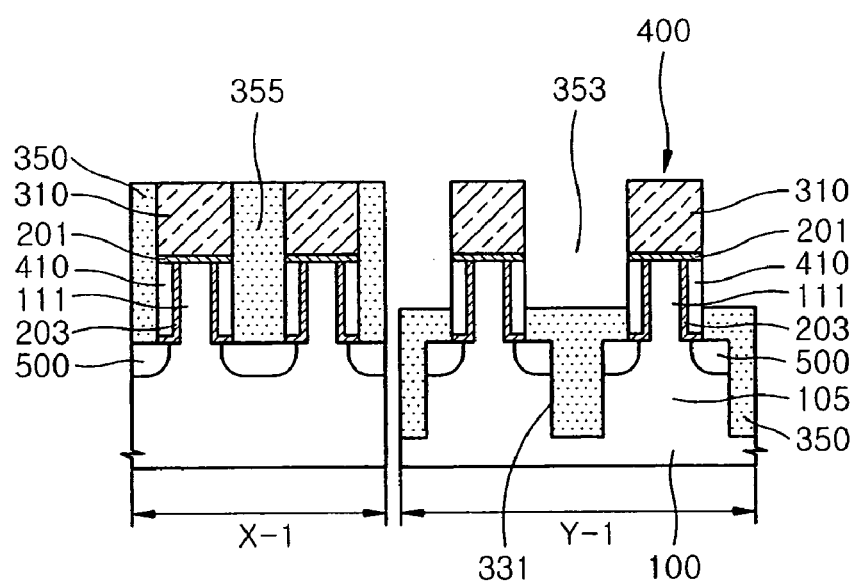

Referring to FIGS. 4I and 4J together with FIGS. 2C and 3H, the first insulation layer 350 is selectively etched to form a first damascene groove 351 for the first local interconnection line 620 on the peripheral circuit region 20. Also, a second damascene groove 353 for the wordline 710 (as illustrated in FIG. 2D) is formed on the first insulation layer 350 in the cell region 10. Here, regions X-1 and Y-1 in FIG. 4J can be considered as sections taken along lines X-1 and Y-1 in FIG. 3H, respectively.

The first and second damascene grooves 351 and 353 are preferably formed by selectively etching the first insulation layer 350 by about 1500-2000 Å to expose the sidewall of the gate electrode of the transistor pillar 400 in a side direction. For example, the first and second damascene grooves 351 and 353 can be formed through a first selective etching process to expose about half of the side surface of gate electrode 410, but not the corresponding buried bitline 500.

Meanwhile, the first insulation layer 350 can also be selectively etched to form a contact hole 355 for the first interconnection contact 610 illustrated in FIGS. 2C and 3H. The contact hole 355 can be formed through a second selective etching process (different from the first selective etching process) to expose the corresponding buried bitline 500.

The contact hole 355 can be formed to overlap the first damascene groove 351, before or after the formation of the first and second damascene grooves 351 and 253.

Figure 4K:
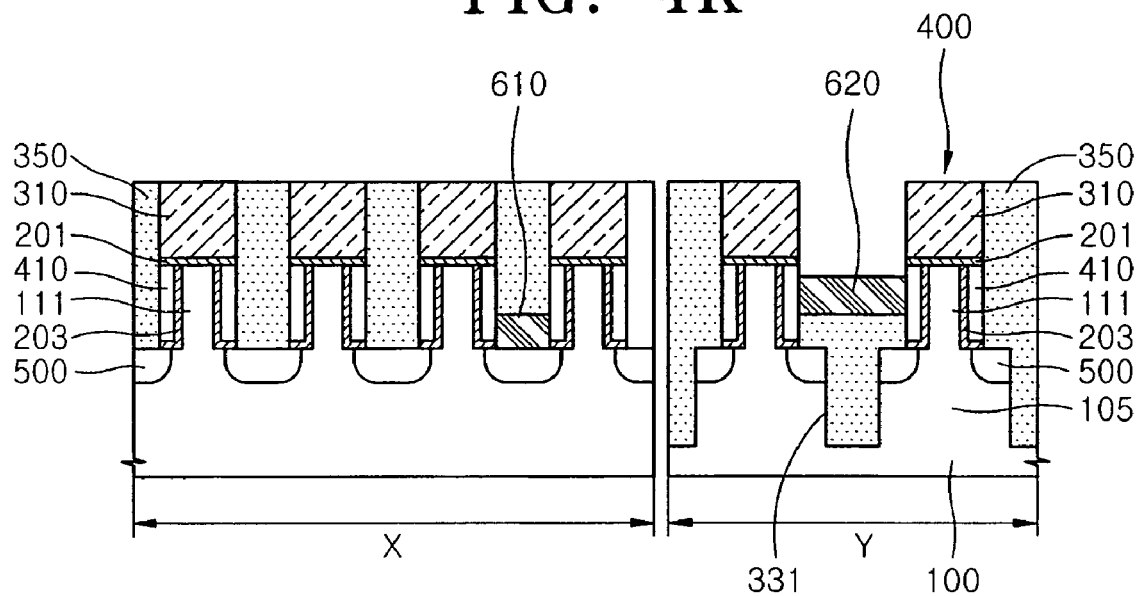
Figure 4L:
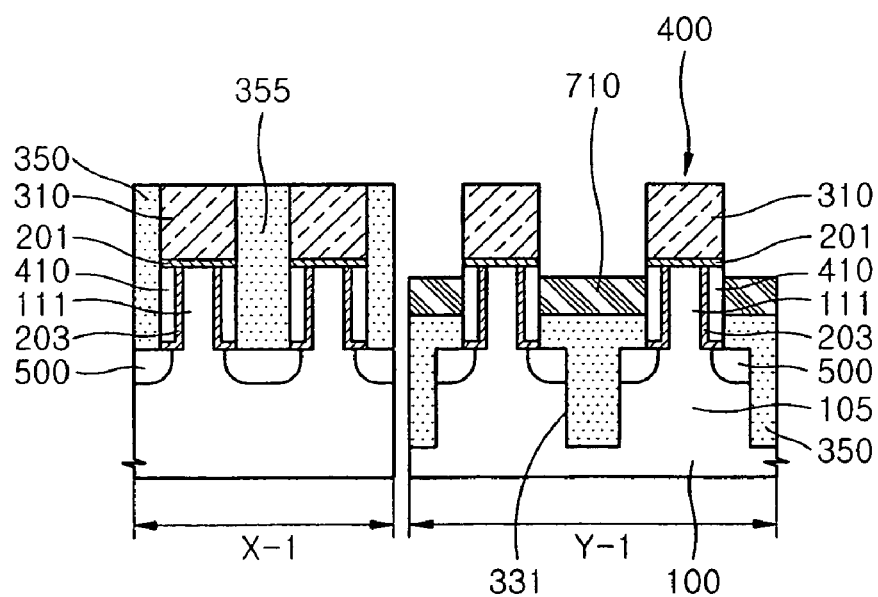

Referring to FIGS. 4K and 4L, a conductive layer is formed to fill the first and second damascene grooves 351 and 353. The conductive layer can be formed of a conductive material selected from the group consisting of conductive polysilicon, tungsten (W), cobalt (Co), tungsten silicide ($WSi_x$), cobalt silicide ($CoSi_x$), titanium silicide ($TiSi_x$), nickel silicide ($NiSi_x$), and a combination thereof. Thereafter, the conductive layer is planarized by CMP so that nodes are separated by the portions filling the first and second damascene grooves 351 and 353. Thereafter, the divided conductive layer is etched and recessed to a depth of about 500-1000 Å to form the first local interconnection line 620 and the wordline 710 in the first damascene groove 351 and the second damascene groove 353, respectively.

At this point, the conductive layer is also formed to fill the contact hole 355 such that the first interconnection contact 610 filling the contact hole 355 is connected to the first local interconnection line 620. The first interconnection contact 610 can be separately formed by a conductive layer formation process and a partial etch-back process, or can be formed by a separate contact formation process rather than during the damascene line formation process for the wordline 710.

Figure 4M:
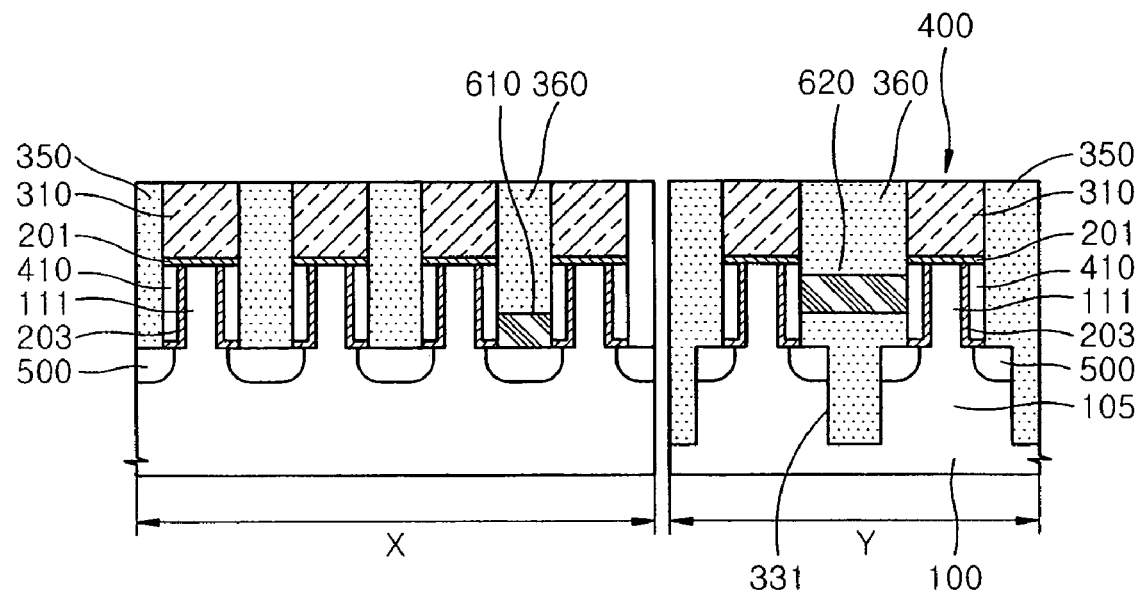
Figure 4N:
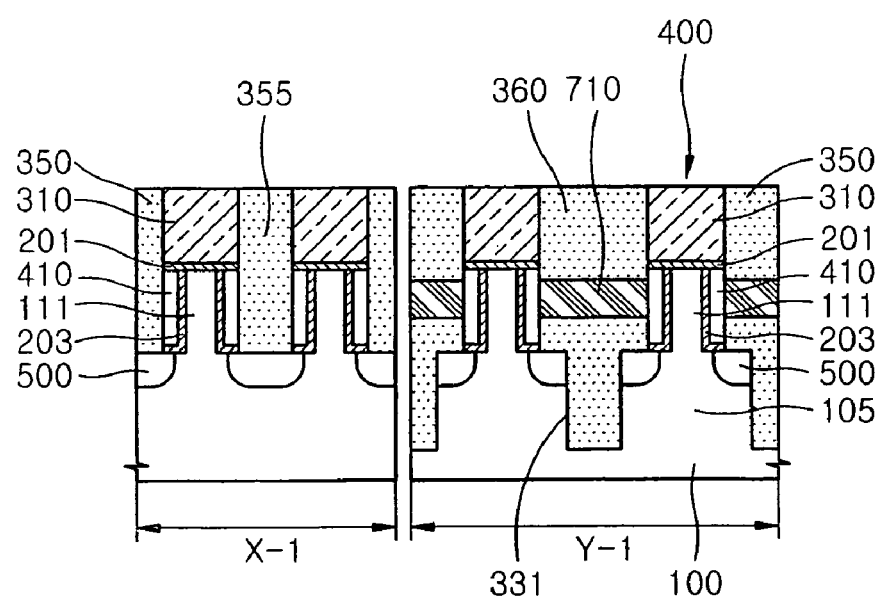

Referring to FIGS. 4M and 4N, a second insulation layer 360 is formed to fill the recessed portions on the first local interconnection line 620 and the wordline 710, and the resulting structure is planarized by CMP to the level of the first hard mask 310.

FIG. 2E is a plan view illustrating a layout for forming contacts of a second (top) source/drain region, and FIGS. 3J and 4O through 4Q are perspective or sectional views illustrating a process of forming the second source/drain region contacts.

Figure 3J:
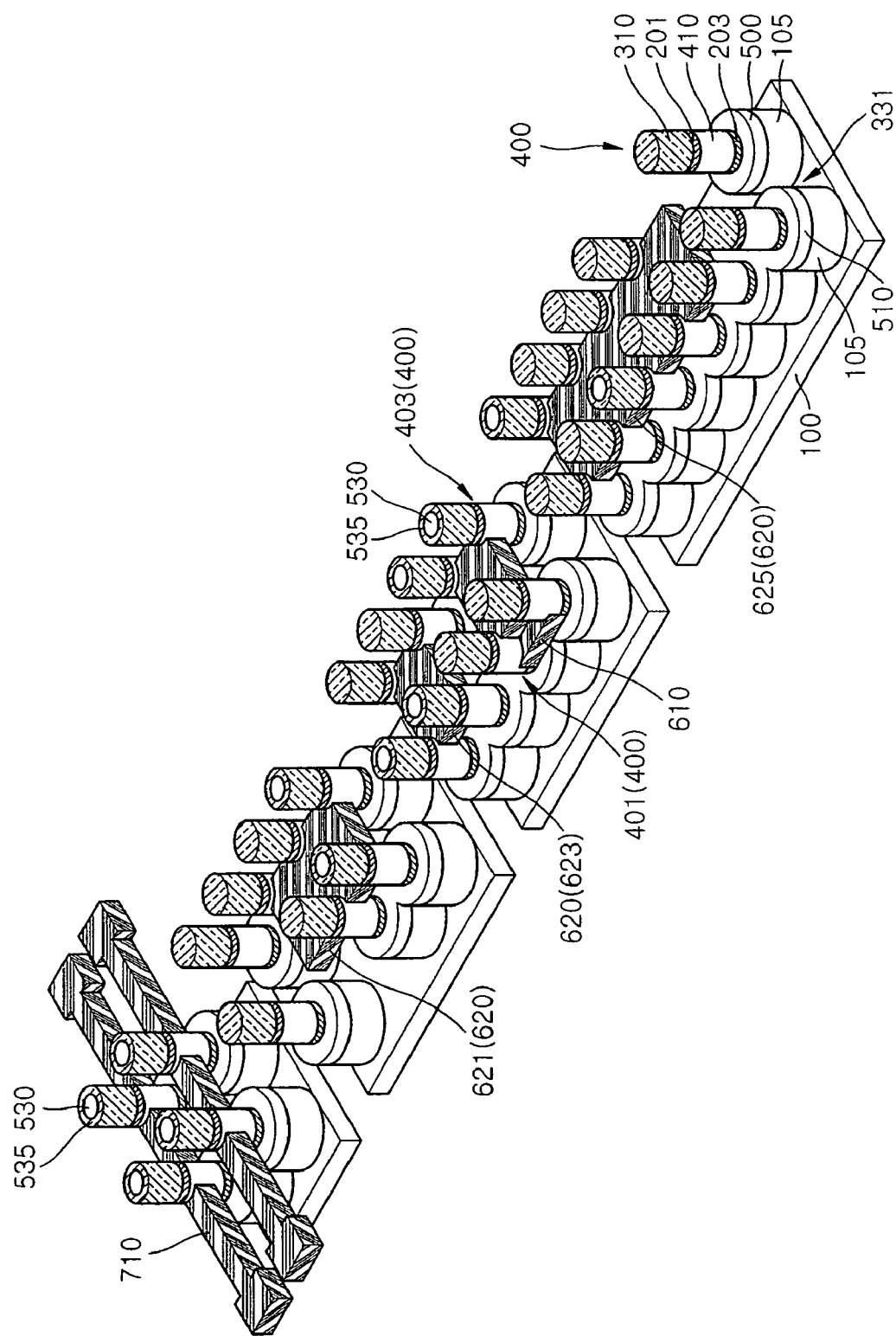

Referring to FIGS. 2E and 3J, in order to form contacts 530 (to be used for the second source/drain region) at transistor pillars 403 (which are to be actually. used for a transistor) among the transistor pillars 400, an etch mask with an opening portion 800 for selectively exposing the upper surfaces of the transistor pillars 403 is formed as illustrated in FIG. 2E.

At this point, transistor pillars 401 that are not exposed by the opening portion 800 are defined as dummy pillars 401. Although a plurality of the transistor pillars 400 are formed in the peripheral circuit region 20, only some of them can be used to constitute the circuit. Therefore, the dummy pillars 401 are present in the peripheral region 20.

Accordingly, the opening portion 800 can have a layout including a first opening portion 811 for fully exposing the cell region 10, a second opening portion 812 for an EQ transistor, a third opening portion for an SA transistor, and a fourth opening portion for a CSL transistor.

Figure 4O:
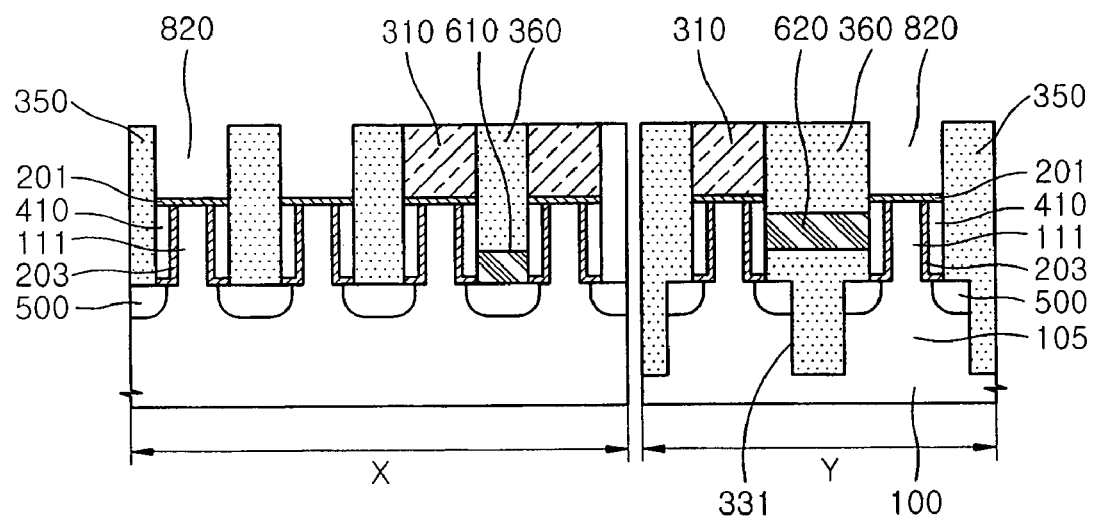

The etch mask with the opening portion 800 is formed on the first hard mask 310 and the first and second insulation layers 350 and 360. Using the etch mask, the first hard mask 310 is selectively etched to expose a surface of the first gate dielectric layer 201 on the channel pillar 111 as illustrated in FIG. 4O. When the first hard mask 310 is formed of silicon nitride, it can be selectively etched using an phosphoric acid solution as an etching solution.

Consequently, a portion of the first hard mask 310 corresponding to the opening portion 800 is removed to form a top contact hole 820. At this time, it can be understood that the first hard mask 310 of the transistor pillar 400 in the cell region 10 is substantially completely removed.

Figure 4P:
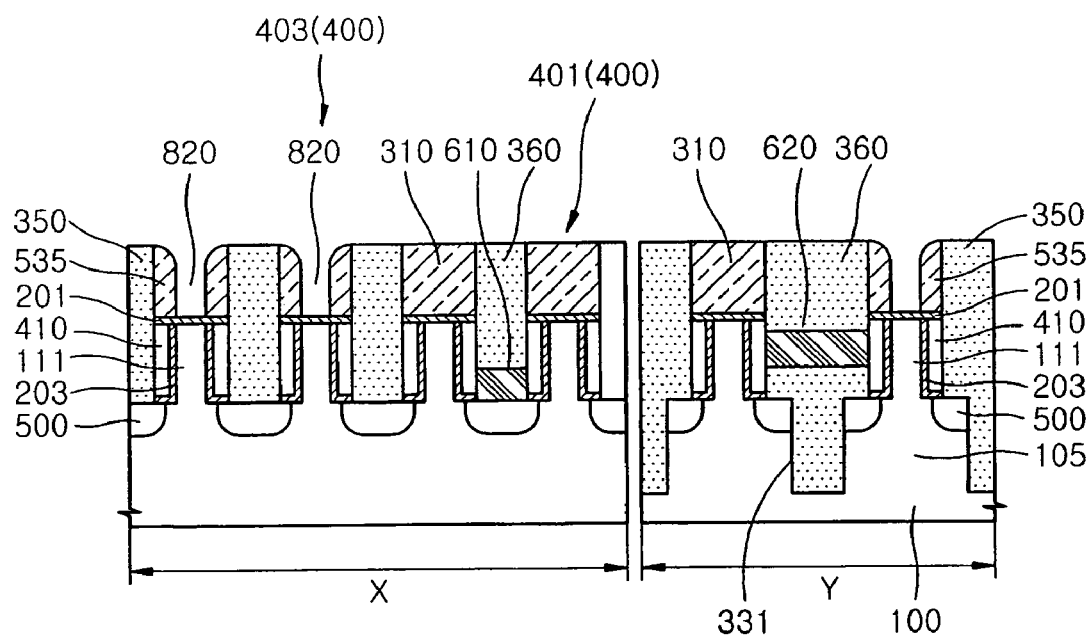
Figure 4Q:
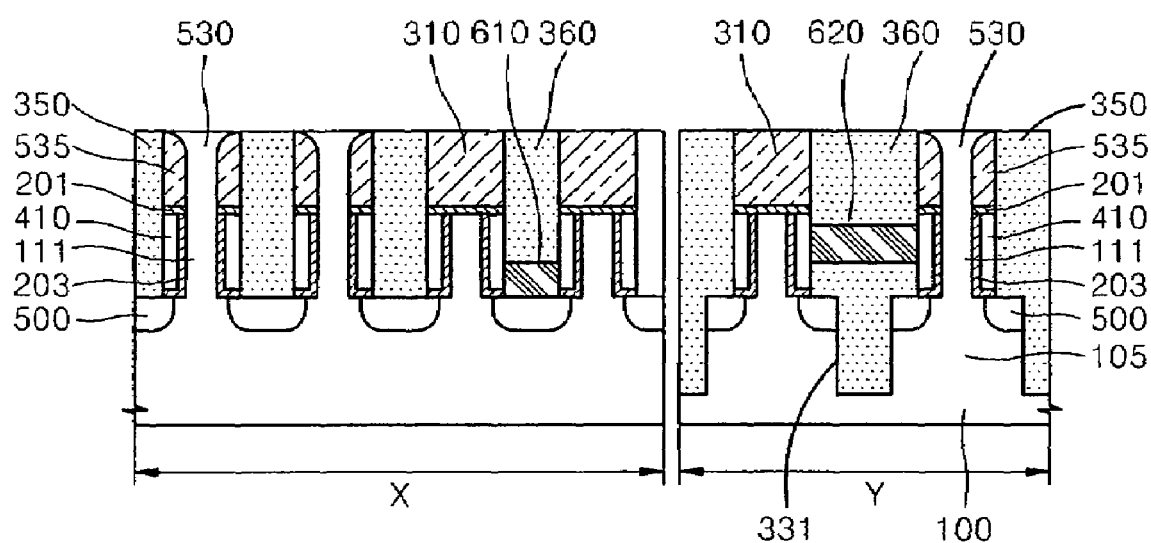

Referring to FIG. 4P, an insulation spacer 535 having an etch selectivity with respect to the first and second insulation layers 350 and 360 is formed on the sidewall of the top contact hole 820. The insulation spacer 535 can be formed by depositing an insulation layer (e.g., a silicon nitride layer) by a thickness of about 300-400 Å and anisotropically etching the deposited insulation layer. At this point, a portion of the first gate dielectric layer 201 exposed by the insulation spacer 535 is preferably formed to overlap a region included in the region of the channel pillar 111.

The anisotropic etching process for forming the insulation spacer 535 continues to be performed to selectively remove the exposed portion of the first gate dielectric layer 201, thereby exposing the upper surface of the channel pillar 111. At this point, it is preferable that the gate electrode 410 is not exposed. In an alternative embodiment, the etching process for the exposing the upper surface of the channel pillar 111 can be performed separately from the etching process for forming the insulation spacer 535.

Referring to FIG. 4Q, the top contact hole 820 is filled to form a top contact 530 that is connected to the upper surface of the exposed channel pillar 111 and serves as the second source/drain region contact. For example, a conductive layer (e.g., a conductive polysilicon layer, a metal layer, and a silicide layer) is deposited by a thickness of about 500-1000 Å, and the resulting structure is node-separated by etch-back or CMP to form the top contact 530. An impurity ion implantation process for the second source/drain region can be further performed on the upper surface of the exposed channel pillar 111 prior to the filling of the top contact 530. At this point, n-conductivity type impurities can be implanted into a region for an n-MOS transistor, and p-conductivity type impurities can be implanted into a region for a p-MOS transistor.

As a result, the pillar-type vertical transistor is completely formed.

Figure 3K:
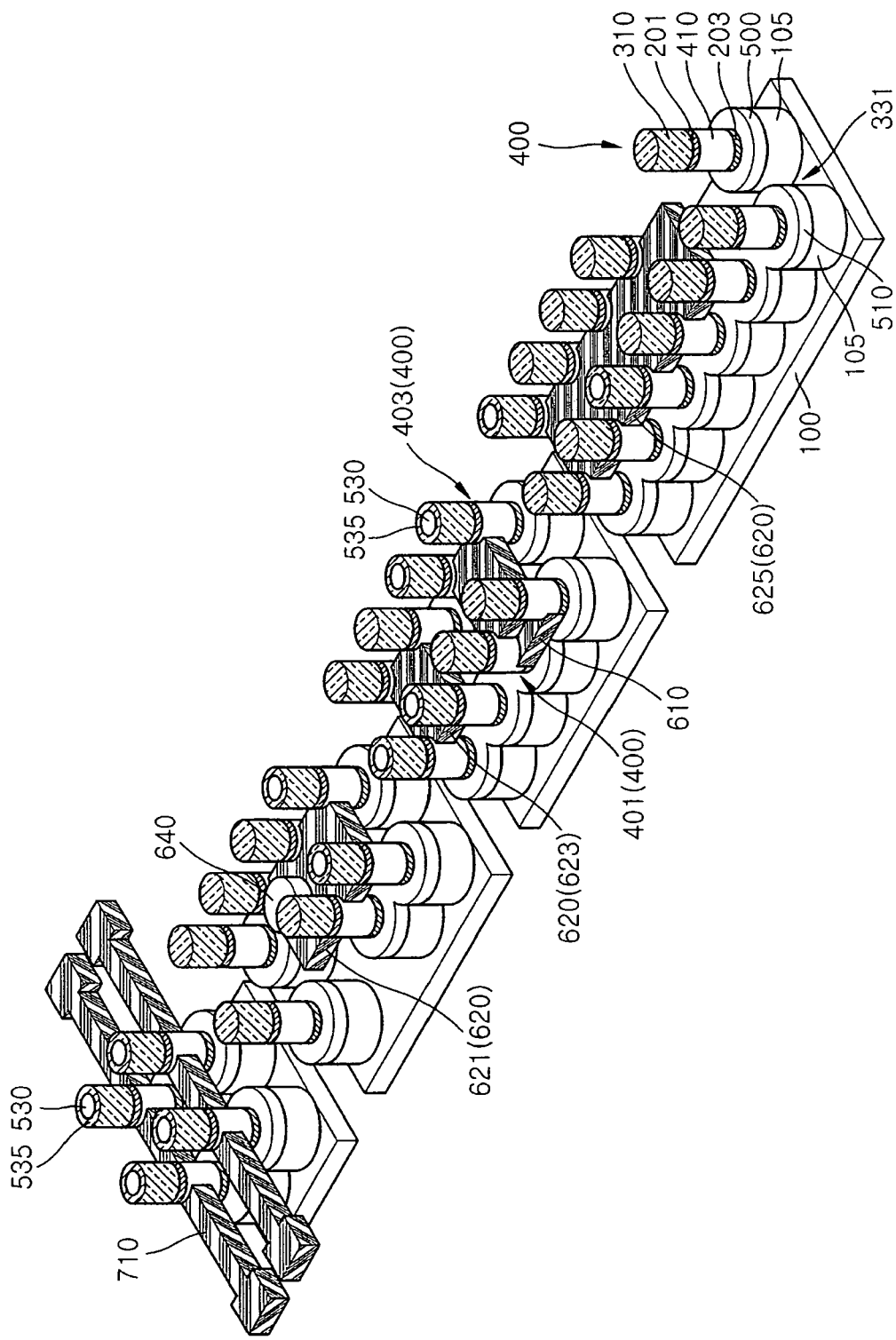

FIG. 2F is a plan view illustrating a layout for forming a second interconnection contact connected to the first local interconnection line, and FIG. 3K is a perspective view illustrating a process of forming the second interconnection contact.

Referring to FIGS. 2F and 3K, a second interconnection contact 640 is formed to make contact with selected ones of the first local interconnection lines 620, for example, the first local interconnection line 621, for constituting the EQ circuit. The EQ circuit is configured such that gate electrodes 410 of two transistors 403 connected to two neighboring buried bitlines 500 are commonly connected. For this purpose, the first local interconnection line 621 electrically interconnects the gate electrodes of the two transistors 403, and the second interconnection contact 640 is formed to make contact with the first local interconnection line 621.

The second interconnection contact 640 can be implemented by forming a contact hole penetrating the second insulation layer 360 to expose the upper surface of the first local interconnection line 621 and forming a conductive layer (e.g., a metal layer) filling the formed contact hole.

The second interconnection contact 640 can be formed by a separate process as described above, or can be formed during a process of depositing and patterning the subsequent metal layer to form signal lines.

FIG. 2G is a plan view illustrating a layout for forming a first signal line, and FIG. 3L is a perspective view illustrating a process of forming the first signal line.

Referring to FIGS. 2G and 3L, a first signal line 910 is formed such that it is electrically connected to the top contact 530 serving as the second source/drain region contact. For example, a metal layer such as an aluminum layer is formed and patterned to form the first signal line 910 in the peripheral circuit region 20. The first signal line 910 is patterned so as to be suitable for an EQ 911, a VBL 912, an LAB 913, an LA 913, an IO 914, and/or an IOB 915 circuit.

At this point, a wordline signal line 917 connected to the wordline 710 is also formed together with the first signal line 910. A contact hole forming process or a contact forming process for connecting the wordline signal line 917 to the wordline 710 can precede the above wordline signal line forming process.

Figure 3M:
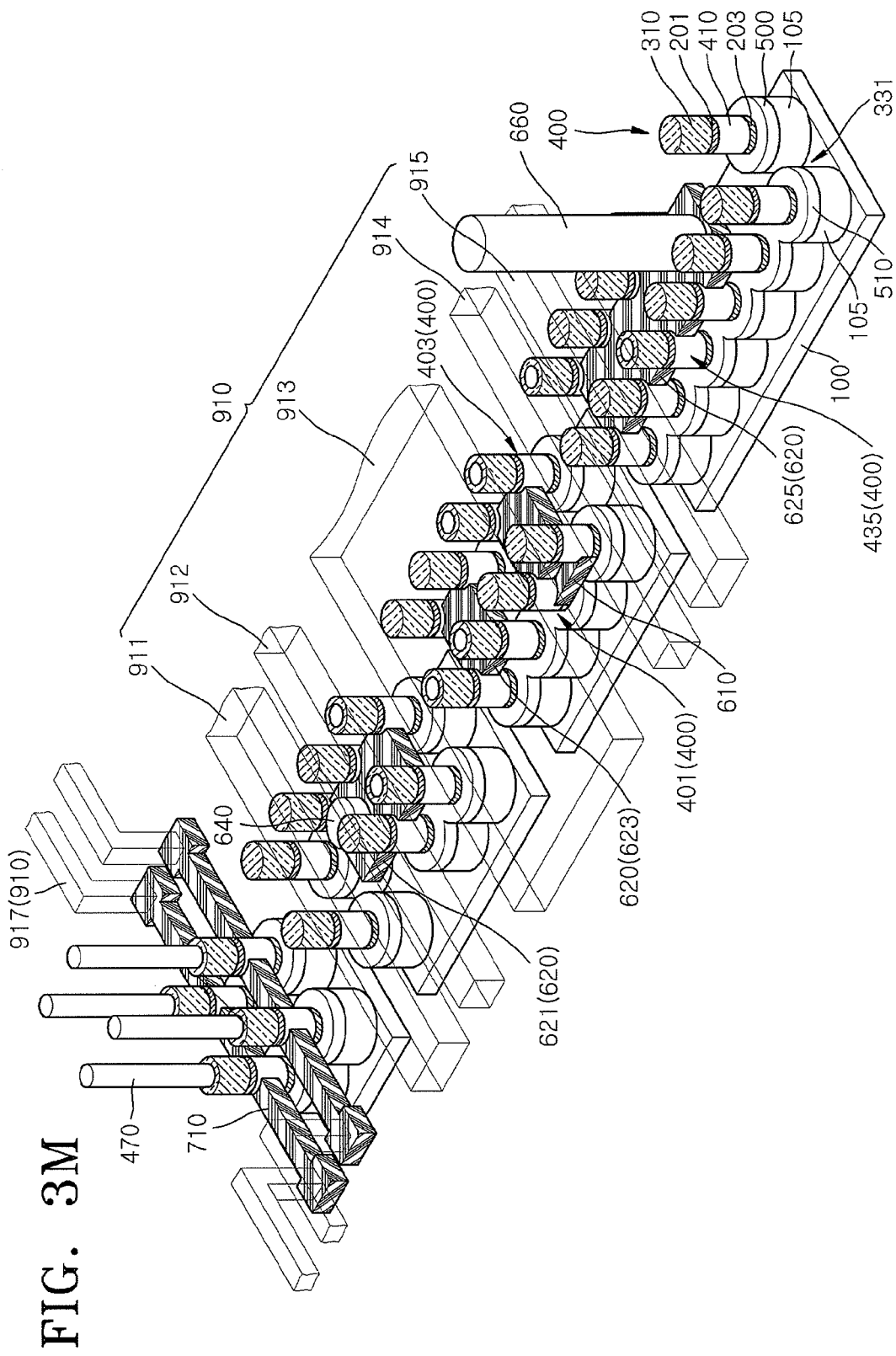

FIG. 2H is a plan view illustrating a layout for forming a third interconnection contact connected to a second signal line, and FIG. 3M is a perspective view illustrating a process of forming the third interconnection contact.

Referring to FIGS. 2H and 3M, a third interconnection contact 660 is formed to contact selected ones of the first local interconnection lines 620, for example, the first local interconnection line 625 for constituting the CSL circuit. The CSL circuit is configured such that gate electrodes 410 of two IO and IOB transistors 435 connected to two neighboring buried bitlines 500 are commonly connected. For this purpose, the first local interconnection line 625 electrically interconnects the gate electrodes of the two transistors 435, and the third interconnection contact 660 is formed to contact the first local interconnection line 625.

The third interconnection contact 660 can be implemented by forming an intermetal dielectric (IMD) layer (not illustrated) covering the first signal line 910, forming a contact hole penetrating the IMD layer to expose the upper surface of the second local interconnection line 625 and forming a conductive layer (e.g., a metal layer) filling the formed contact hole.

A capacitor 470 electrically connected to the top contact 530 of the cell transistor is formed in the cell region 10 to constitute a memory cell circuit device prior to the formation of the third interconnection contact 660, for example, the IMD layer. At this point, a storage electrode of the capacitor 470 can be formed in the shape of a cylindrical storage electrode, as known and understood in the art of memory device fabrication. Thereafter, a dielectric layer (not illustrated) and a top electrode (not illustrated) are formed to complete the capacitor 470.

FIGS. 2I and 3N are respectively a plan view or a perspective view illustrating a process of forming a second signal line.

Referring to FIGS. 2I and 3N, a second signal line 930 for a CSL signal line is formed. For example, a metal layer such as an aluminum layer is formed on the IMD layer, and the formed metal layer is patterned to form the second signal line 930 overlapping the third interconnection contact 660 on the peripheral circuit region 20.

Although the circuit device according to the present disclosure has been described as being manufactured by the above processes, the signal line structure of the circuit device can be changed variously in accordance with desired design parameters and fabrication techniques.

Figure 5:
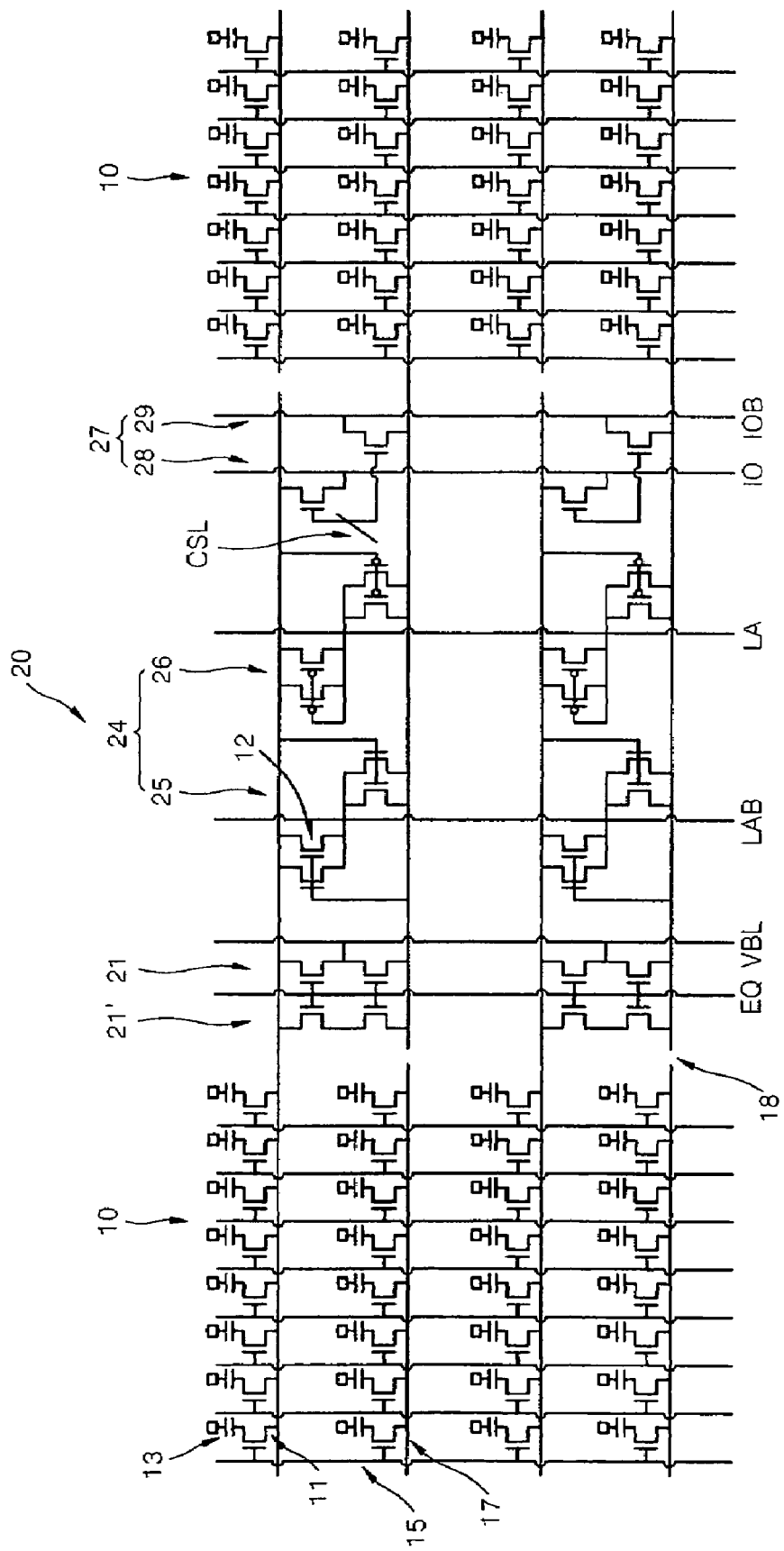
FIG. 5 is a circuit diagram of a circuit device including vertical transistors connected to buried bitlines according to another embodiment of the present invention.
Figure 6:
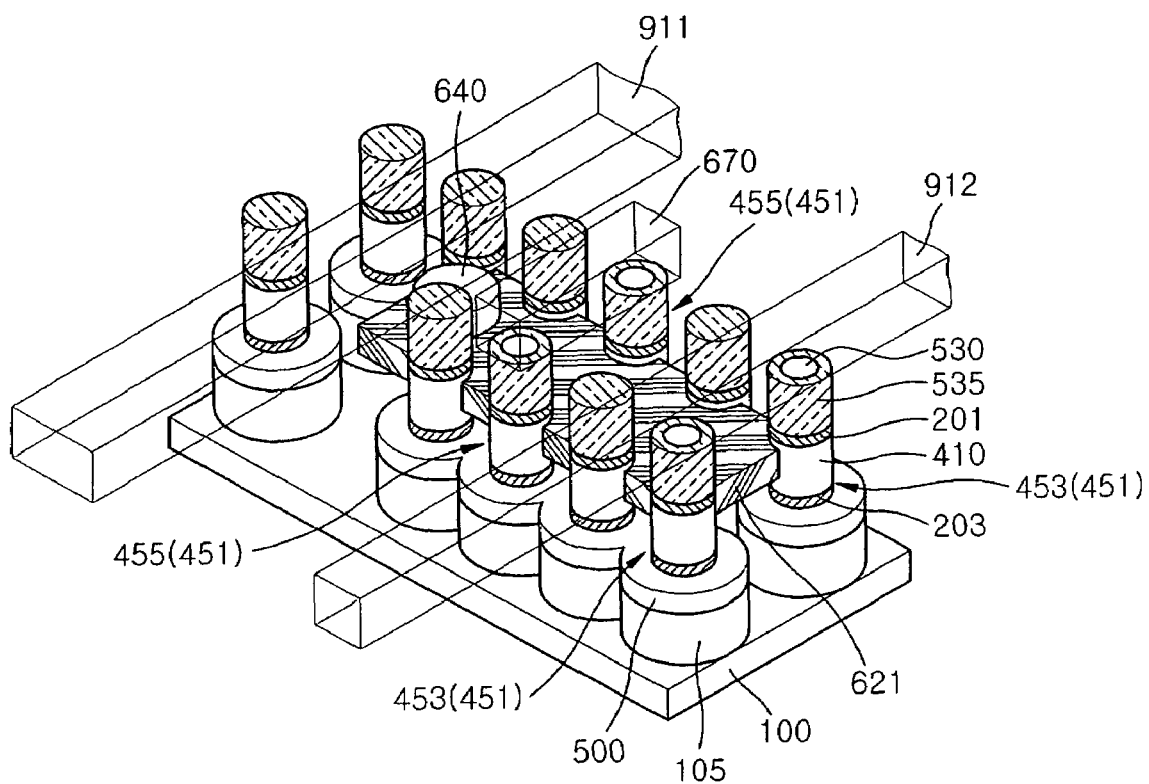
FIG. 6 is a schematic perspective view of the circuit device illustrated in FIG. 5 according to another embodiment of the present invention.

FIG. 5 is a circuit diagram of a circuit device including vertical transistors connected to buried bitlines according to another embodiment of the present disclosure, and FIG. 6 is a schematic perspective view of the circuit device illustrated in FIG. 5 according to another embodiment of the present disclosure.

Referring to FIGS. 5 and 6, unlike the EQ circuit 21, an EQ circuit 21' can be formed to further include a pair of transistors having nodes that are connected to two neighboring buried bitlines 500. That is, gate electrodes 410 of four transistors 451 can be connected to a first signal line 911 for an EQ signal 621 through a first local interconnection line 621 and a second interconnection contact 640, and top contacts 530 of a pair of transistors 453 can be connected to a first signal line 912 for a VBL signal. At this point, top contacts 530 of another pair of transistors 455 can be interconnected by a second local interconnection line 670. The second local interconnection line 670 can be formed to have the same height, or level above the substrate, as the first signal line 911.

Figure 7:
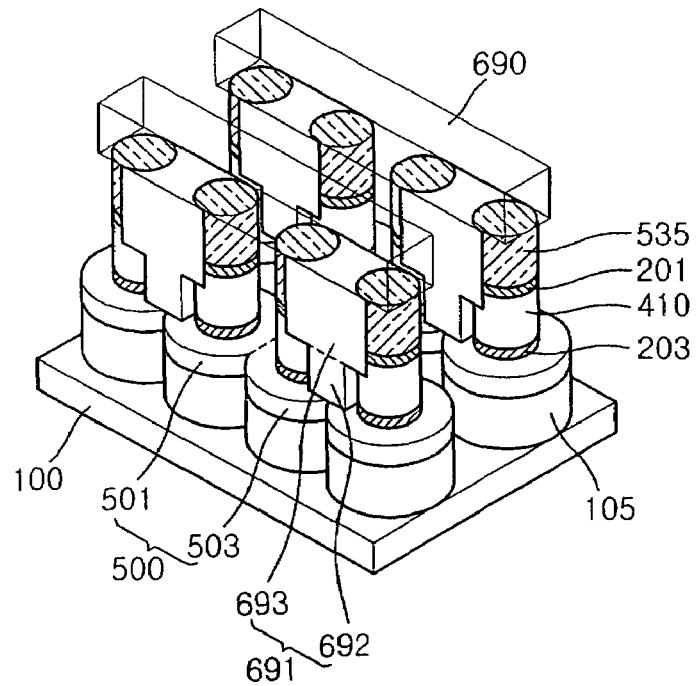
FIG. 7 is a perspective view illustrating a local interconnection line for buried bitline connection according to an embodiment of the present invention.

FIG. 7 is a perspective view illustrating a local interconnection line for buried bitline connection according to an embodiment of the present invention.

Referring to FIG. 7, a buried bitline 500 can be considered as being extended by the junction of first and second buried bitlines 501 and 503 doped with different conductivity types in a pSA transistor region and an nSA transistor region. In this case, the first buried bitline 501 (e.g., an $N^+$ impurity region) and the second buried bitline 503 (e.g., a $P^+$ impurity region) has a p-n junction interface therebetween. Accordingly, the buried bitline 500 can have fourth interconnection contacts 691 penetrating a first insulation layer 350 to contact with the first and second buried bitlines 501 and 503, respectively, and a third local interconnection line 690 connecting the fourth interconnection contacts 691 can be formed during the formation of the first signal line 910. Consequently, a signal flowing through the buried bitline 500 can be transmitted from the first buried bitline 501 to the second buried bitline 503 without being interrupted by the p-n junction.

Although not illustrated, the first and second buried bitlines 501 and 503 can be spaced apart from each other by a device isolation structure without forming a p-n junction. In this case also, the first and second buried bitlines 501 and 503 can be electrically connected by the fourth interconnection contact 691 and the third local interconnection line 690.

The fourth interconnection contact 691 can be formed to include a lower portion 692 formed together with the first interconnection contact 610, and an upper portion 693 formed together with the second interconnection contact 640.

According to the embodiments of the present invention described above, it is possible to implement the circuit device that includes the vertical transistors and the interconnection line structure including the buried bitlines connected to the vertical transistors. Consequently, it is possible to reduce the substrate area required for the cell region and the peripheral circuit region.

While the present invention has been particularly shown and described with reference to exemplary embodiments thereof, it will be understood by those of ordinary skill in the art that various changes in form and details can be made therein without departing from the spirit and scope of the present invention as defined by the following claims.

What is claimed is:

1. A circuit device including vertical transistors, the circuit device comprising:
    a semiconductor substrate including a peripheral circuit region and left and right cell regions at both sides of the peripheral circuit region;
    bottom active regions arranged on the semiconductor substrate to be spaced apart from one another in a column direction and to extend from the peripheral circuit region alternately to the left cell region and the right cell region in a row direction;
    channel pillars protruding from the bottom active regions in a vertical direction and arranged to be aligned in the row direction and spaced apart from one another;
    gate electrodes provided with a gate dielectric layer and attached to surround side surfaces of the channel pillars;
    buried bitlines extending along the bottom active regions, the bottom active regions including a bottom source/drain region;
    local interconnection lines contacting side surfaces of the gate electrodes in the peripheral circuit region and extending between the gate electrodes to commonly interconnect the gate electrodes in the peripheral circuit region, thereby configuring a peripheral circuit;
    signal lines electrically connected to upper surfaces of the channel pillars or to at least one of the local interconnection lines; and
    interconnection contacts electrically connecting the local interconnection line to the buried bitline of a different row from that of the commonly-connected gate electrodes or electrically connecting the local interconnection lines to the signal lines, thereby configuring the peripheral circuit.

2. The circuit device of claim 1, wherein the bottom active region is extended to one of the left and right cell regions but disconnected with respect to the other of the left and right cell regions such that the buried bitline is extended from the peripheral circuit region only to the one of the left and right cell regions.

3. The circuit device of claim 1, wherein the buried bitline includes an impurity region self-aligned with the gate electrode by ion implantation of impurities into the bottom active region exposed between neighboring gate electrodes.

4. The circuit device of claim 1, wherein the local interconnection line is disposed between two gate electrodes, each belonging to a different row, to electrically interconnect the two gate electrodes.

5. The circuit device of claim 4, further comprising an insulation mask insulating the upper surface of the channel pillar to define the channel pillar with a neighboring gate electrode in the row direction attached thereto as a dummy pillar so as to allow the interconnection line to contact another gate electrode neighboring the gate electrode in the row direction.

6. The circuit device of claim 4, further comprising another local interconnection line formed together with the signal line to locally connect the channel pillars of the different row and formed to have a substantially same height relative to the substrate as that of the signal line.

7. The circuit device of claim 1, further comprising an insulation mask insulating the upper surface of the channel pillars to define the channel pillars with the gate electrodes of the neighboring row attached thereto as a dummy pillar so as to allow the local interconnection line to be extended to contact two gate electrodes of a particular row and a gate electrode of a row different from the particular row such that the two gate electrodes of the particular row are electrically interconnected.

8. The circuit device of claim 1, further comprising an insulation mask insulating the signal line from the upper surface of the channel pillar neighboring the channel pillar electrically connected to the signal line, thereby defining the neighboring channel pillar as a dummy pillar.

9. The circuit device of claim 1, wherein the interconnection contact connected to the buried bitline is formed to contact the gate electrode adjacent to a connected portion of the connected bitline, and the circuit device further comprises an insulation mask electrically insulating the upper surface of the channel pillar such that the channel pillar to which the gate electrode contacting the interconnection contact is attached is defined as a dummy pillar.

10. The circuit device of claim 1, wherein the peripheral circuit is an equalizer, a sense amplifier or a column selector for a memory operation of cell transistors including the gate electrode and the channel pillar formed in the cell region.

11. The circuit device of claim 1, wherein the buried bitline includes first and second buried bitlines with a different conductivity type, the first and second buried bitlines being interconnected, and the circuit device further comprises:

another local interconnection line formed together with the signal line to interconnect the first and second buried bitlines and formed to have a substantially same height relative to the substrate as that of the signal line; and another interconnection contact connecting the another local interconnection line to each of the first and second buried bitlines.

12. The circuit device of claim 11, wherein the first and second buried bitlines are spaced apart form each other by device isolation.

13. The circuit device of claim 1, further comprising a top contact electrically connecting the channel pillar to the signal line.

14. A circuit device including vertical transistors, the circuit device comprising:

a semiconductor substrate including a peripheral circuit region and left and right cell regions at both sides of the peripheral circuit region;

bottom active regions arranged on the semiconductor substrate to be spaced apart from one another in a column direction and to extend from the peripheral circuit region alternately to the left cell region and the right cell region in a row direction;

channel pillars protruding from the bottom active regions in a vertical direction and arranged to be aligned in the row direction and spaced apart from one another;

gate electrodes provided with a gate dielectric layer and attached to surround side surfaces of the channel pillars;

buried bitlines extending along the bottom active regions, the bottom active regions including a bottom source/drain region formed outside the gate electrodes;

local interconnection lines contacting side surfaces of the gate electrodes of different rows in the peripheral circuit region and extending between the gate electrodes to commonly interconnect the gate electrodes in the peripheral circuit region, thereby configuring a peripheral circuit including an equalizer;

a first signal line electrically connected to upper surfaces of the two channel pillars of different rows, the two channel pillars each having a gate electrode contacting the local interconnection line;

a second signal line electrically connected to the local interconnection line; and an interconnection contact formed on the local interconnection line to electrically connect the second signal line to the local interconnection line.

15. The circuit device of claim 14, further comprising an insulation mask insulating the first signal line from the upper surface of the channel pillar neighboring the channel pillar electrically connected to the first signal line, thereby defining the neighboring channel pillar as a dummy pillar.

16. A circuit device including vertical transistors, the circuit device comprising:

a semiconductor substrate including a peripheral circuit region and left and right cell regions at both sides of the peripheral circuit region;

bottom active regions arranged on the semiconductor substrate to be spaced apart from one another in a column direction and to extend from the peripheral circuit region alternately to the left cell region and the right cell region in a row direction;

channel pillars protruding from the bottom active regions in a vertical direction and arranged to be aligned in the row direction and spaced apart from one another;

gate electrodes provided with a gate dielectric layer and attached to surround side surfaces of the channel pillars;

buried bitlines extending along the bottom active regions, the bottom active regions including a bottom source/drain region formed in each bottom active region at a side of the gate electrodes;

a signal line electrically and commonly connected to upper surfaces of the channel pillars of different rows in the peripheral circuit region;

local interconnection lines connecting each of the gate electrodes to the buried bitline of a row different from the row which the gate electrodes belong to, thereby configuring a peripheral circuit including a sense amplifier; and an interconnection contact electrically connecting the local interconnection line to the buried bitline of the different rows.

17. The circuit device of claim 16, further comprising an insulation mask insulating the signal line from the upper surface of the channel pillar neighboring the interconnection contact and facing the channel pillar of a different row electrically connected to the signal line, thereby defining the neighboring channel pillar as a dummy pillar.

18. A circuit device including vertical transistors, the circuit device comprising:

a semiconductor substrate including a peripheral circuit region and left and right cell regions at both sides of the peripheral circuit region;

bottom active regions arranged on the semiconductor substrate to be spaced apart from one another in a column direction and to extend from the peripheral circuit region alternately to the left cell region and the right cell region in a row direction;

channel pillars protruding from the bottom active regions in a vertical direction and arranged to be aligned in the row direction and spaced apart from one another;

gate electrodes provided with a gate dielectric layer and attached to surround side surfaces of the channel pillars;

buried bitlines extending along the bottom active regions, the bottom active regions including a bottom source/drain region formed in each bottom active region at a side of the gate electrodes;

a first signal line electrically connected to an upper surface of the channel pillar of a row in the peripheral circuit region;

a second signal line electrically connected to the upper surface of the channel pillar of a row neighboring the row including the channel pillar connected to the first signal line; and a local interconnection line extended from the surface of the gate electrode to electrically connect the gate electrodes attached to the two channel pillars each of which is connected to the first signal line and the second signal line, thereby configuring a peripheral circuit including a column selector;

a third signal line electrically connected to the local interconnection line; and an interconnection contact formed on the local interconnection line to electrically connect the third signal line to the local interconnection line.

19. The circuit device of claim 18, further comprising an insulation mask insulating the first and second signal lines from the upper surface of the channel pillar neighboring, in the row direction, the channel pillar connected to the first and second signal lines, thereby defining the neighboring channel pillar as a dummy pillar.

20. A circuit device including vertical transistors, the circuit device comprising:

a semiconductor substrate including a peripheral circuit region and left and right cell regions at both sides of the peripheral circuit region;

bottom active regions arranged on the semiconductor substrate to be spaced apart from one another in a column direction and to extend from the peripheral circuit region alternately to the left cell region and the right cell region in a row direction;

channel pillars protruding from the bottom active regions in a vertical direction and arranged to be aligned in the row direction and spaced apart from one another;

gate electrodes surrounding sidewalls of the channel pillars;

buried bitlines extending along the bottom active regions, the bottom active regions including a bottom source/drain region;

an upper source/drain region disposed on the channel pillars;

a first gate dielectric layer disposed between the gate electrodes and the upper source/drain region;

a second gate dielectric layer disposed between the gate electrodes and the channel pillars;

local interconnection lines contacting side surfaces of the gate electrodes in the peripheral circuit region and extending between the gate electrodes to commonly interconnect the gate electrodes in the peripheral circuit region, thereby configuring a peripheral circuit;

signal lines electrically connected to upper surfaces of the channel pillars or to at least one of the local interconnection lines; and interconnection contacts electrically connecting the local interconnection line to the buried bitline of a different row from that of the commonly-connected gate electrodes or electrically connecting the local interconnection lines to the signal lines, thereby configuring the peripheral circuit.

* * * * *